(12) United States Patent
Takemura et al.

(10) Patent No.: US 6,538,912 B2
(45) Date of Patent: *Mar. 25, 2003

(54) SEMICONDUCTOR DEVICE

(75) Inventors: Riichiro Takemura, Tokyo (JP);
Tomonori Sekiguchi, Kokubunji (JP);
Katsutaka Kimura, Akishima (JP);
Kazuhiko Kajigaya, Iruma (JP);
Tsugio Takahashi, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/139,330

(22) Filed: May 7, 2002

(65) Prior Publication Data

US 2002/0126520 A1 Sep. 12, 2002

Related U.S. Application Data

(63) Continuation of application No. 09/725,107, filed on Nov. 29, 2000, now Pat. No. 6,400,596.

(30) Foreign Application Priority Data

Dec. 3, 1999 (JP) .......................................... 11-344241

(51) Int. Cl.[7] .............................................. G11C 11/00
(52) U.S. Cl. .............................. 365/63; 365/51; 365/69; 257/776
(58) Field of Search ............................. 365/63, 51, 69, 365/230.04, 205, 206, 207, 208; 257/776, 773, 208

(56) References Cited

U.S. PATENT DOCUMENTS

| 5,396,450 A | 3/1995 | Takashima et al. ............ 365/51 |
| 5,691,933 A | 11/1997 | Takenake ..................... 365/63 |
| 5,838,038 A | 11/1998 | Takashima et al. .......... 257/301 |
| 6,043,562 A | 3/2000 | Keeth .......................... 257/776 |
| 6,222,275 B1 | 4/2001 | Keeth .......................... 257/776 |
| 6,243,311 B1 | 6/2001 | Keeth .......................... 365/206 |

FOREIGN PATENT DOCUMENTS

| EP | 0717414 | 6/1996 |
| JP | 5-41081 | 2/1993 |
| JP | 8-288471 | 11/1996 |
| JP | 8-314112 | 11/1996 |
| JP | 9-135004 | 5/1997 |

OTHER PUBLICATIONS

Ultra Micro–Fabrication Technology, The Japan Society of Applied Physics, G. Tokuyama, 1st Edition issued by Ohm Co., Ltd., Feb. 25, 1997, pp. 27–41.

Primary Examiner—Hoai Ho
Assistant Examiner—Gene N. Auduong
(74) Attorney, Agent, or Firm—Mattingly, Stanger & Malur, P.C.

(57) ABSTRACT

When a phase shift method is used as lithography where sense amplifiers are alternately placed in a one intersecting-point memory capable of implementing a reduction in the area of a DRAM, it was difficult to layout data lines in a boundary region between sense amplifiers and each memory array. Therefore, there is provided a semiconductor device according to the present invention. In the semiconductor device, two data lines continuous within the sub memory arrays or interposed therebetween are connected to the adjacent sense amplifiers as a system for drawing data lines from sub memory arrays (SMA) to sense amplifiers (SA) when the sense amplifiers are alternately placed. Namely, the number of data lines interposed between data lines respectively connected to two adjacent sense amplifiers is set to even numbers (0, 2, 4, . . . ). Owing to the above configuration, a break and a short circuit in a portion where a sense amplifier block and a sub memory array are connected, can be avoided, and a connection layout is facilitated.

5 Claims, 23 Drawing Sheets

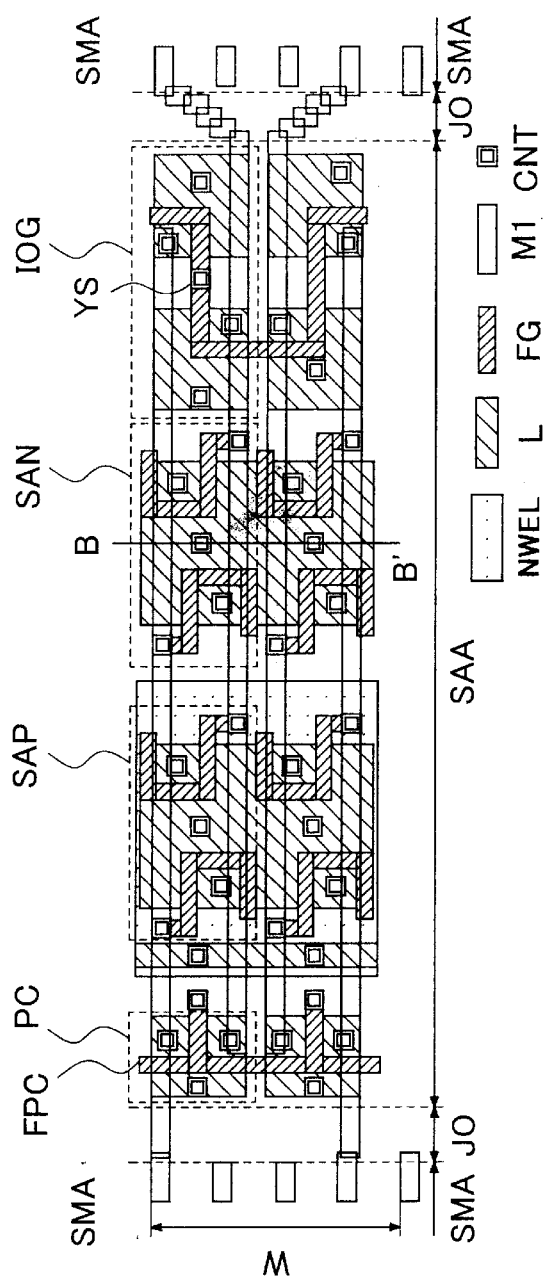
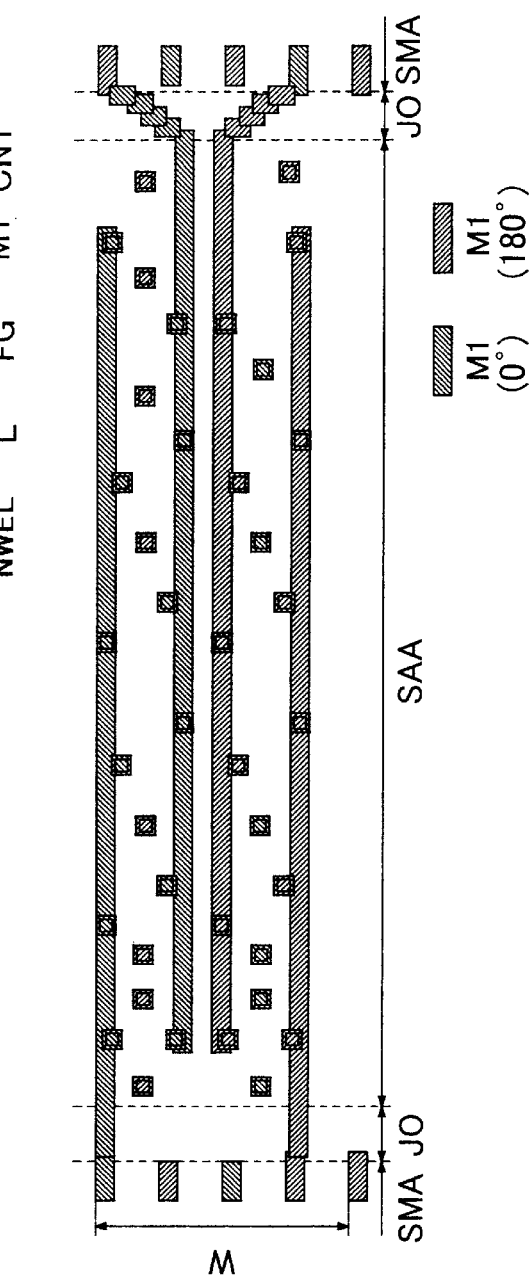
FIG. 16A
FIG. 16B

SEMICONDUCTOR DEVICE

This is a continuation application of U.S. Ser. No. 09/725,107, filed Nov. 29, 2000, now U.S. Pat. No. 6,400,596.

FIELD OF THE INVENTION

The present invention relates to a semiconductor device, and particularly relates to structures of memory array and sense amplifier units included in the semiconductor device.

BACKGROUND OF THE INVENTION

A list of references referred to by the present specification is as follows. Reference will be made to such references according to reference numbers. They are [Reference 1]: Japanese Patent Laid-Open No. H5-41081, [Reference 2]: Ultra Micro-Fabrication Technology, pp. 27–41, Edited by The Japan Society of Applied Physics/Author: Gi Tokuyama, First Edition issued by Ohm Co., Ltd., Feb. 25, 1997, and [Reference 3]: Japanese Patent Laid-Open No. H9-135004.

The [Reference 1] describes the layout or placement of sense amplifiers and data lines where an open data line arrangement is taken in divided plural memory mats. In particular, FIG. 3 describes sense amplifiers of a so-called alternate-layout type that one sense amplifier is placed per two data lines adjacent to each other, and one thereof is connected to its corresponding sense amplifier of the right side sense amplifier block, whereas the remaining one is connected to its corresponding sense amplifier of the left side sense amplifier block. [Reference 2] describes a phase shift method indicating one lithography technology for forming micro or fine patterns on the semiconductor wafer. [Reference 3] describes an example illustration of mask patterns in a memory array of a so-called one intersecting-point memory cell system.

Two types of typical memory array constituting methods of (1) the one intersecting-point memory cell method or system (or open data line arrangement) and (2) the two intersecting-point memory cell method or system (folded data line arrangement) are known for a dynamic random access memory (DRAM). Commercializing of products has been started from DRAM of the one intersecting-point memory cell system historically. However, the one intersecting-point memory cell system has been changed over to the two intersecting-point memory cell system with a 64K-bit DRAM as the boundary. The present commercialized 256M-bit DRAM also uses the two intersecting-point memory cell system. It is however known that the theoretical minimum memory cell area employed in DRAM is equal to eight times ($8F^2$) the square of the minimum feature size F in the two intersecting-point memory cell system, whereas the minimum memory cell area is equal to $6F^2$ reduced by 25% from $8F^2$ in the one intersecting-point memory cell system. Here, the minimum feature size F corresponds to the minimum interval required to separate between patterns, which is determined by the technology of processing a semiconductor integrated circuit, such as optical lithography or the like. The minimum feature size F is the design unit. Namely, all the mask patterns are designed with F as the unit in the semiconductor integrated circuit, and a specific size of F is applied thereto according to a realistic processing technology. If the two intersectinq-point memory cell system is kept using from now on, then one simply depends on a reduction in the minimum feature size F. A drastic reduction in memory cell area cannot be expected. Therefore, the inventors of the present invention have discussed the application of the one intersecting-point memory cell system capable of expecting the reduction in the memory cell area under the design technique to an array configuration or structure of mass-storage memories.

FIG. 23 shows a memory array which adopts bit-line multi-division and a sense-amplifier alternate layout in the one intersecting-point memory cell system described in FIG. 3 of [Reference 1]. In the present memory array, the connections of sense amplifiers and data lines are made according to a simple one rule. Data lines for one memory array (e.g., SMA(i)) are connected to an adjacent two sense amplifiers (e.g., SA1 and SA2) on alternate lines (e.g., DR(i)1 and DR(i)2). As shown in this figure, one intersecting-point array having memory cells at all points where word lines and data lines intersect, needs to lay out one sense amplifier for two data lines even if the sense amplifiers are alternately placed. The pitch of wiring for implementing the layout shown in FIG. 23 is limited by the lithography technology.

As the lithography technology for forming fine or micro-patterns, the phase shift method has been used in recent years. Traditional photo-masks had openings for controlling the simple transmission of light alone. On the other hand, each of photo-masks employed in the phase shift method has a first opening for allowing light to pass therethrough, and a second opening for allowing the light to pass therethrough with the phase of the transmitted light as a 180° difference with respect to the first opening (shifting the phase thereof by 180° and allowing the light to pass). When lights cancel each other out in an area to which the first opening and the second opening adjoin, finer lithography is accomplished even if the same wavelength of light is used. Details on the phase shift method itself have been described in [Reference 2]. The assignment of phases to their corresponding patters (phase layout or arrangement) becomes an important upon adoption of the phase shift method. Namely, the wiring-to-wiring pitch must be extended depending on phase assignment methods. Unless the most suitable phase assignment is done, a layout area cannot be reduced.

The inventors of the present invention have noticed the need for special consideration to the method of connecting the sense amplifiers and the data lines for the memory cell arrays upon forming the memory arrays having adopted the bit line multi-division and the sense amplifier alternate layout in the one intersecting-point memory cell system by using the phase shift method. Namely, unless consideration is given to the phase assignment, wiring pitch and patterns, failures such as a break in wiring and a short circuit in wiring are apt to occur in the boundary between areas in which patterns such as those for the memory arrays and sense amplifiers are different.

SUMMARY OF THE INVENTION

An object of the present invention is therefore to provide a system for laying out sense amplifiers, which is required to implement a one intersecting-point system corresponding to a memory array configuration or structure capable of reducing a chip area.

More specifically, the present invention aims to implement a pattern system for wiring data lines between memory arrays and sense amplifiers, which is suitable for lithography using a phase shift method.

A typical example of the present invention will be explained as follows: There is provided a semiconductor device comprising a first memory array including a plurality of first memory cells provided at points where a first data line group including first through fourth data lines, and a plurality of first word lines intersect; a second memory array including a plurality of second memory cells provided at points where a second data line group including fifth through eighth data lines, and a plurality of second word lines intersect; and a first sense amplifier block provided in an area between the first and second memory arrays and including first and second sense amplifiers adjacent to each other, wherein the first sense amplifier is connected to the first data line and one of the data lines included in the second data line group so as to take an open data line arrangement, the second sense amplifier is connected to the fourth data line and another one of the data lines included in the second data line group so as to take an open data line arrangement, and the second and third data lines are placed between the first data line and the fourth data line.

BRIEF DESCRIPTION OF THE DRAWINGS

FIG. 16A shows mask patterns of FIG. 14;

FIG. 16B still shows mask patterns of FIG. 14;

DETAILED DESCRIPTION OF THE PREFERRED EMBODIMENT

Preferred embodiments of the present invention will hereinafter be described in detail with reference to the accompanying drawings.

Although not restricted in particular, circuit elements, which constitute respective blocks employed in the embodiments, are formed on a single semiconductor substrate like mono-crystal silicon by the known integrated circuit technology of CMOS (Complementary MOS transistors) or the like. Of circuits symbols of MOSFETs (Metal Oxide Semiconductor Field Effect Transistors), those free of arrows represent N-type MOSFETs (NMOS) and are distinguished from P-type MOSFETs (PMOS) with arrows. MOSFETs are simplified in the interest of an abbreviated name and is called "MOS". However, the present invention is not limited only to a field effect transistor including an oxide insulating film provided between a metal gate and a semiconductor layer. The present invention is applied to a circuit using common FETs such as MISFETs (Metal Insulator Semiconductor Field Effect Transistors), etc.

First Embodiment

Figure 1:
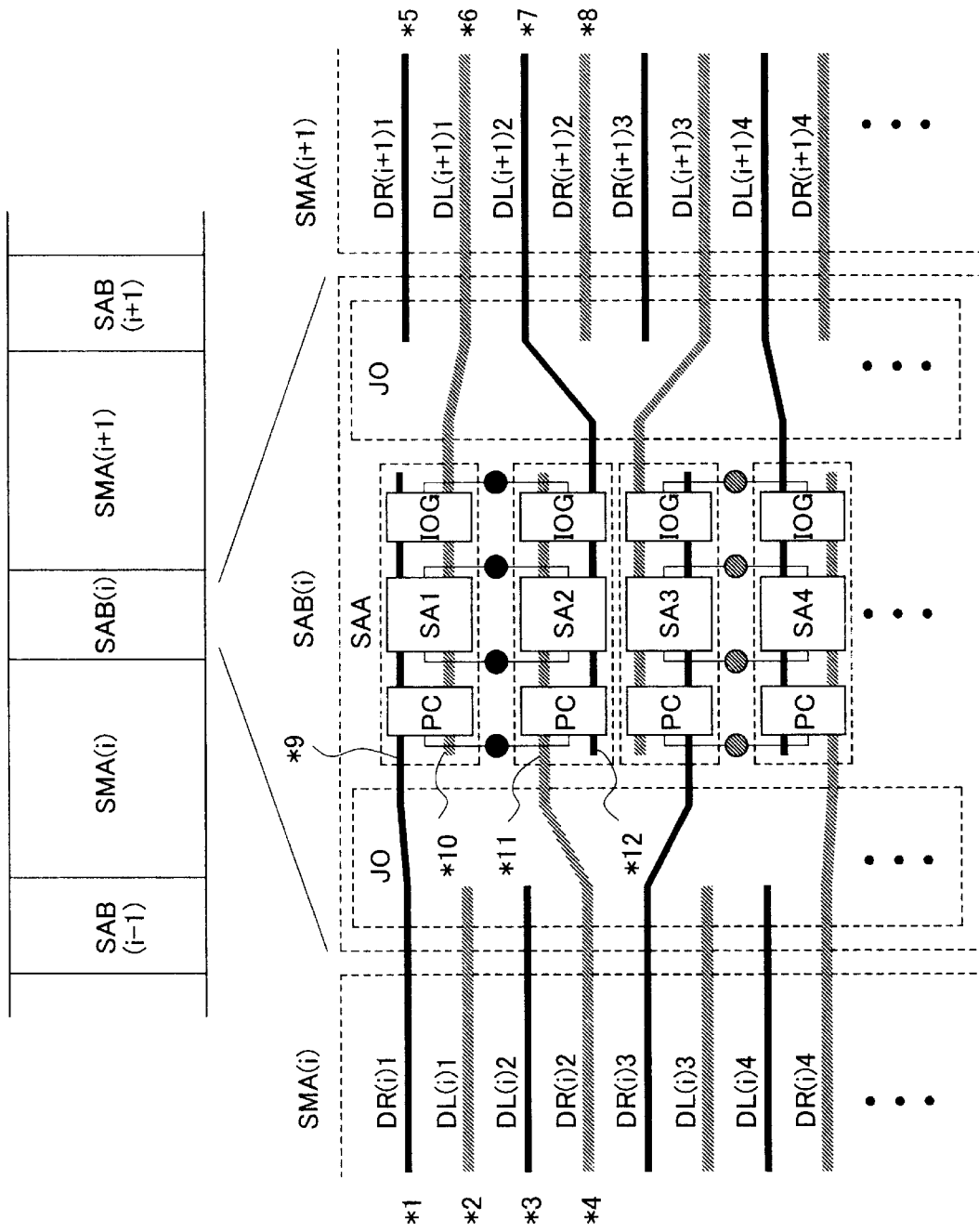
FIG. 1 is a connection layout showing data lines employed in a first embodiment (4:5 arrangement (part 1))

FIG. 1 is a diagram typically showing a characteristic portion of a region in which data lines and sense amplifiers employed in a first embodiment of the present invention are connected to one another. Prior to the description of detailed internal characteristics of FIG. 1, a description will be given from a global image of a semiconductor device to which the present invention is applied, with reference to FIGS. 8 and 9.

[1-1. Overall Configuration of SDRAM]

Figure 8:
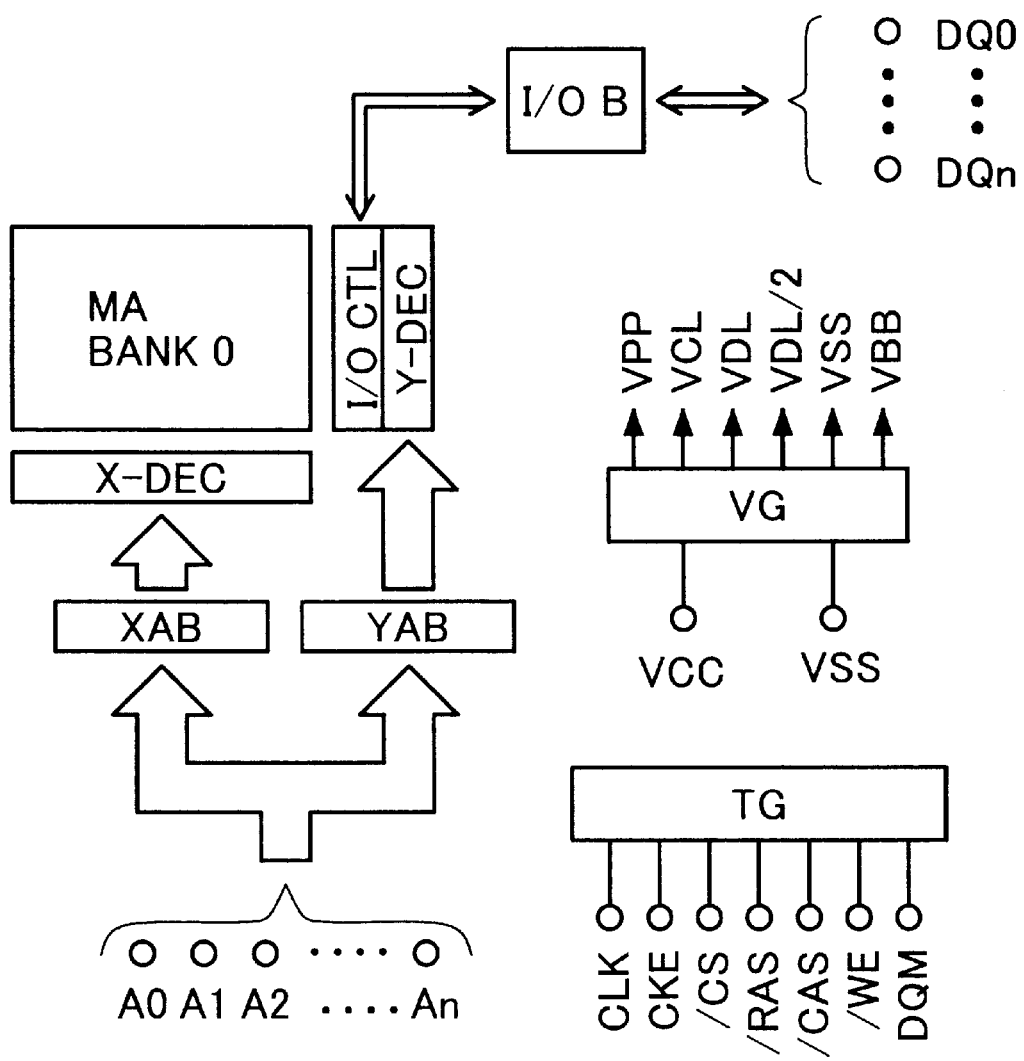
FIG. 8 is a block diagram showing the whole synchronous DRAM.

FIG. 8 shows an overall block of a synchronous DRAM (SDRAM) indicating a typical example to which the present invention is applied. Respective circuit blocks are operated according to timing for internal control signals formed or produced by a timing signal generator TG to which control signals are inputted. The control signals inputted to the TG include a chip select signal/CS, a row address strobe signal/RAS, a column address strobe signal, and a write enable signal/WE, which are inputted with timing for a clock signal CLK. Combinations of these control signals and address signals are called commands. A clock enable signal CKE determines whether the clock signal is valid or invalid. Further, an input/output mask signal DQM is a signal for controlling a data input/output buffer I/O B to mask data inputted and outputted from input/output terminals (DQ0, . . . DQn). VG is a voltage generator of the SDRAM, which supplies a step-up or boosting voltage for each word line (VPP), a substrate or board voltage (VBB), an array voltage (VDL), a peripheral circuit voltage (VCL), etc.

The SDRAM adopts an address multi-system wherein a row address and a column address are inputted from address input terminals (A0, A1, . . . An) on a time-sharing basis. A row address inputted to a row address buffer XAB is decoded by a row decoder X-DEC to select a specific word line in one memory array MA, whereby a memory cell corresponding to one word is in a selected state correspondingly. When a column address is inputted to a column address buffer YAB subsequently, a memory cell for performing reading or writing is further selected by a column address decoder Y-DEC. Incidentally, while the SDRAM normally has a plurality of memory arrays (or memory banks) specified by bank addresses respectively, only one memory array MA (BANK 0) is typically illustrated in the present drawing.

Figure 9:
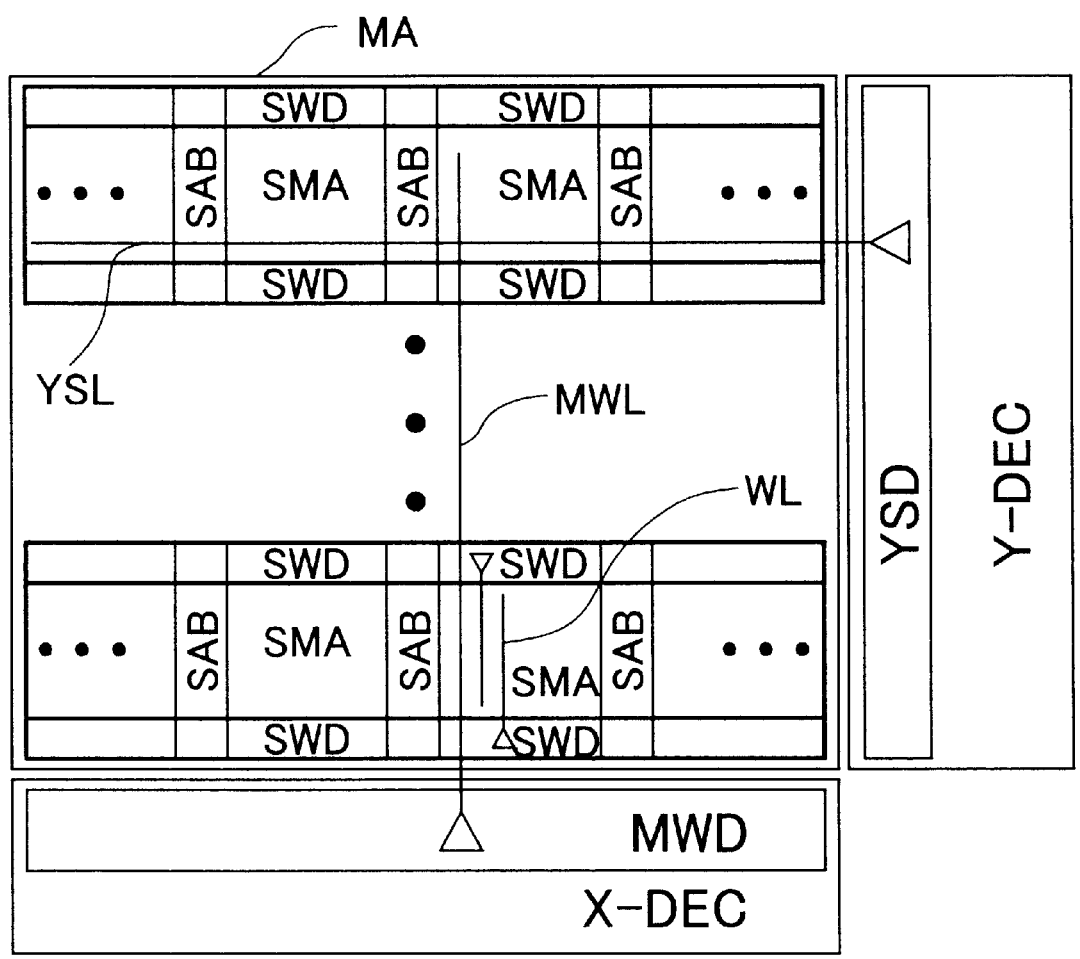
FIG. 9 is a block diagram illustrating details on a memory bank.

FIG. 9 shows an enlarged view of the neighborhood of the memory array MA. The memory array MA includes a plurality of sub memory arrays SMA placed in matrix form. Although not restricted in particular, the memory array MA adopts a hierarchical word line architecture and has one side along which a main word driver sequence MWD is placed. A main word line MWL connected to the MWD is provided in a metal wiring layer (M2 wiring layer) corresponding to an upper layer so as to extend over the plurality of SMA. A configuration of each sub memory array SMA is a one intersecting-point memory array structure or configuration wherein memory cells are respectively placed in all points where a plurality of word lines (WL1, WL2, WL3, WL4, . . . ) and a plurality of data lines (D1, D2, D3, D4, . . . ) intersect.

Sub word drivers SWD respectively provided in association with word lines are respectively provided above and below the sub array memories SMA. Each sub word driver SWD is activated by a control signal from the main word line MWL and a FX driver FXD to select its corresponding one word line. The FX drivers FXD are respectively provided within cross areas XA, each corresponding to a region or area surrounded by SWD and SAB. However, only blank boxes are drawn in FIG. 9. When a word shunt system is adopted as an alternative to the hierarchical word line architecture, through holes and contacts for connecting word lines for the lining each formed of a metal such as A1, which are provided in an upper layer, and word lines each common to a gate of a lower poly-silicon layer are provided within SWD as an alternative to the sub word drivers. In this case, SWD can be called word shunt areas respectively. A common Y decoder system wherein column select lines YSL outputted from column select line drivers YSD of the column decoder Y-DEC are provided so as to extend over the plurality of sub memory arrays (SMA), is adopted for the selection of a column direction. The column select lines YSL are typically formed in an M3 wiring layer corresponding to a layer above M2. With regard to the entire memory array referred to above, the present invention relates to internal configurations of the sub memory arrays SMA and sense amplifier blocks SAB placed repeatedly. These detailed structures are shown in FIG. 1.

[1-2. 4:5 Arrangement (Part 1)]

FIG. 1 shows the layout of one sense amplifier block SAB(j) and a portion or unit in which sub memory arrays (SMA(i), SMA(i+1)) are placed on both sides. This figure is characterized in that in SMA, four data lines are placed within a predetermined width W, whereas in SAB, five data lines (four data lines and one contact pad sequence) are substantially placed in a predetermined width W in a manner similar to above. Therefore, the embodiment shown in FIG. 1 is called "4:5 layout or arrangement".

This layout includes repeated patterns in which four sense amplifiers SA1 to SA4 extend as one group in an X direction (the direction in which word lines extend, is hereinafter defined as the X direction) in SAA. However, connection patterns for SA3 and SA4 can be regarded as ones produced by mirror reflected inverting of patterns for SA1 and SA2.

This layout is characterized in that data lines (*9 and *10) lying inside the sense amplifier and data lines (*1 and *6) for the sub memory array are simply connected to SA1, whereas data lines (*11 and *12) lying inside the sense amplifier and data lines (*4 and *7) for the sub memory array are connected to SA2 with twists. Further, the layout shown in FIG. 1 includes simple repeated patterns with respect to a Y direction (the direction in which data lines extend, is hereinafter defined as the Y direction). The memory array can be extended by repeatedly placing the same patterns in the Y direction. Namely, a repeat layout or arrangement of SMA and SAB can be implemented by connecting the same one as shown in FIG. 1 to the right side of SMA(i+1). Therefore, the expansion of the memory array is easy.

Within the sub memory array SMA, DL(i)0, DL(i)1, . . . , DR(i)0, DR(i)1, . . . , DL(i+1)0, DL(i+1)1, . . . , DR(i+1)0, DR(i+1)1, . . . indicate data lines respectively. Let's assume that data lines (e.g., DR(i)1 and DR(i+1)1) corresponding to each other as viewed from side to side in SMA(i) and SMA(i+1) are all placed on the same virtual lines and no displacements occur in the X direction. On the other hand, data lines lying within each sense amplifier block are placed so as to slightly shift in the X direction from the virtual lines on which the data lines for SMA are placed. The respective data lines are placed in parallel at predetermined intervals within one sub memory array. Memory cells are omitted from the present figure. The present invention is characterized in that data lines can be connected even to a memory array having such a high-density layout that the interval between the data lines reaches twice the minimum feature size F as described later in FIG. 5A. Although not restricted in particular, the present invention can expect a noticeable or pronounced effect in particular where F is less than 0.16 µm with the light source for the generation ahead of the oscillation of an excimer laser with KrF (wavelength: 248 nm) gas as a premise.

In the present invention, a phase shift method corresponding to lithography using optical interference is used to form high dense patterns for pattern formation of data lines. In FIG. 1, two types of solid and broken lines are drawn as the data lines. However, they are ones which represent the arrangement or layout of phases by the phase shift method. Namely, a phase of 0° is assigned to the solid line, and a phase of 180° is assigned to the broken line by way of example. Incidentally, it is of importance that a phase difference of 180° exists between the solid line and the broken line. The value of the phase itself is not important. Since the phase arrangement for adjacent data lines is placed in opposite phase as being 180° out-of-phase as shown in FIG. 1, each wiring pitch can theoretically be reduced to a wavelength of exposure light.

It is necessary to give special consideration to the layout in the sense amplifier block SAB because the connection of power lines or the like as well as the data lines is required. The sense amplifier block SAB(j) comprises a plurality of sense amplifier areas SAA and an area J0 in which SAA and the data lines are connected to one another. In the layout of the sense amplifier area SAA, patterns (contact pads) for contact, which are used for control/drive lines, an IO line, a power line, etc. in addition to the data lines, are provided one row with respect to two SAA so as to fall in the same layer (M1) as the data lines. In FIG. 1, the contact pads are represented by black circles and diagonally-shaded circles respectively. The black circles are set to the same phase as the data lines indicated by solid lines on a phase shift mask. It is necessary to substantially form patterns equivalent to five data lines with a predetermined width within SAB for the purpose of laying out such a contact pad sequence. Therefore, the phase layout or arrangement cannot simply be matched with the data lines between SMA and SAA. Thus, the present invention has revealed a connecting method (patterns for connecting areas J0) related to the connections of data lines between SMA and SAA and for taking matching with a phase layout.

Of the four data lines (e.g., *1 to *4) adjacent to each other continuously within SMA, the two data lines (e.g., *1 and *4) are connected to their corresponding adjacent SAA (SA1 and SA2) in J0. The remaining two data lines (e.g., *2 and *3) are connected to adjacent SAA of a sense amplifier block (SAB(j−1) or SAB(j+1)) provided on the side opposite to each other. Of the continuous data lines DR(i)1, DL(i)1, DR(i)2, DR(i)2, DR(i)3, DL(i)3, DL(i)4, and DR(i)4 shown in FIG. 1, for example, the data lines connected to the adjacent SAA of SAB(j) correspond to DR(i)1, DR(i)2 with the two data lines interposed therebetween, DR(i)3 adjacent to DR(i)2, and DR(i)4 with the two data lines interposed therebetween. Since the respective adjacent data lines take area phase-reversal patterns even within the connection area J0 even in the case of SAA, their layout can be facilitated. Thus, since the phase shift patterns for the data lines are opposite in phase, the wiring width/space can be set to the minimum feature size F.

The generalized configuration of the present invention introduced from the embodiment shown in FIG. 1 is as follows: The number of data lines interposed between the respective data lines connected to two adjacent sense amplifiers is set as an even number. Here, the even number is defined as 0, 2, 4, . . . and a progression including 0. However, 0 or 2 actually bring about the most satisfactory result. This will be explained again using a specific example. The two (even-numbered) data lines (*2 and *3) are interposed between the data lines (*1 and 4) connected to the left sides of SA1 and SA2. On the other hand, no data lines exist between the data lines (*6 and *7) connected to the right sides of SA1 and SA2. This also could lead to the fact that 0 (even-numbered) data lines are interposed therebetween. Further, 0 (even-numbered) data lines are interposed between the data lines (DR(i)2 and DR(i)3) connected to the left sides of SA2 and SA3. Namely, the above-described generalized configuration is established between the arbitrary adjacent two sense amplifiers shown in FIG. 1.

If the above generalized configuration is adopted, then a phase difference of 180 degrees can be assigned to the wiring patterns without contradiction in the respective areas for the sub memory array SAM, the connection areas J0 and the sense amplifier area SAA upon fabrication of the data lines through the use of the phase shift masks. As a result, the processing accuracy of the data lines is enhanced and the scale down thereof is promoted. The concept of the generalized configuration referred to above is also applied to second and third embodiments to be described later as well as to the first embodiment.

Figure 2:
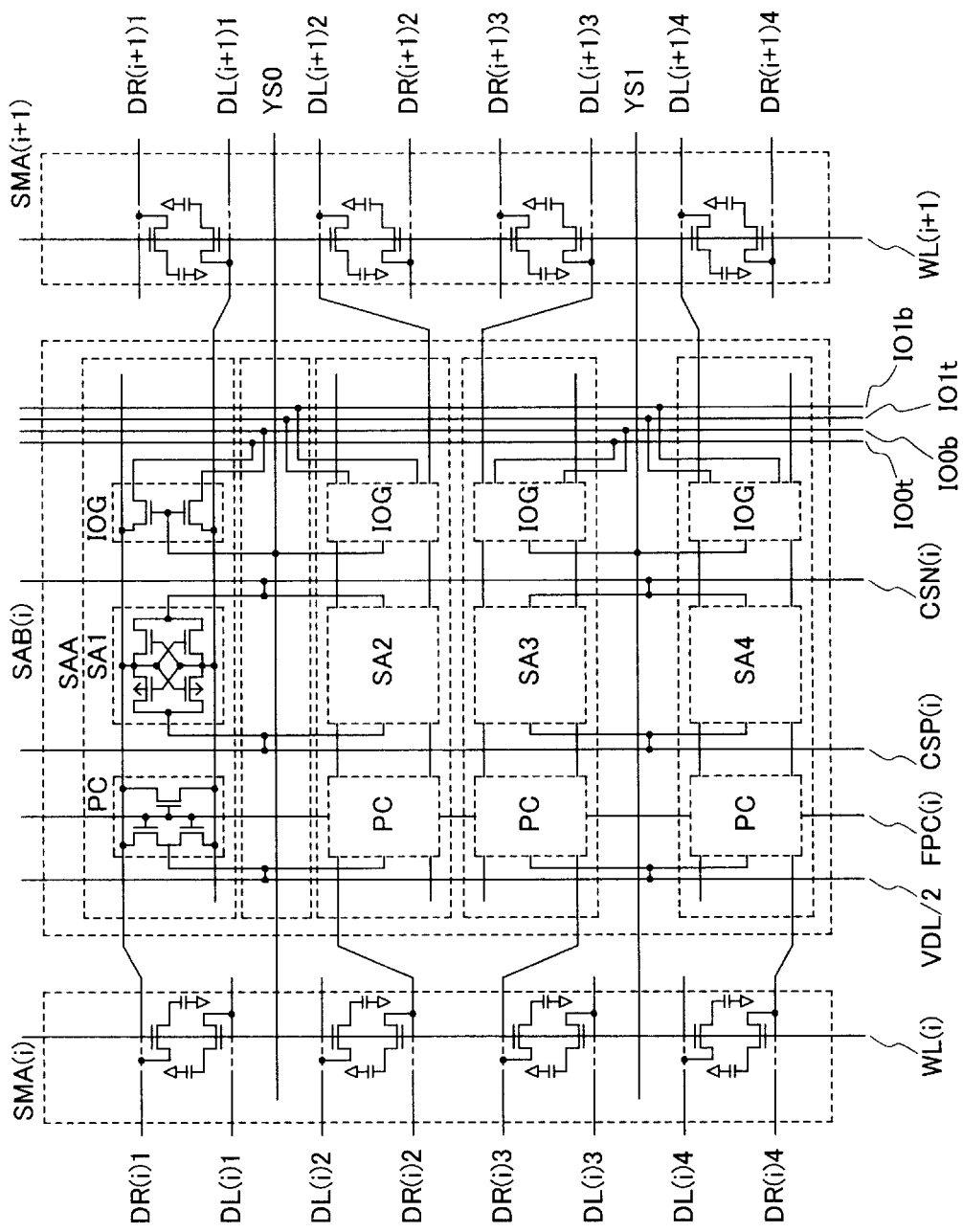
FIG. 2 is a circuit diagram of FIG. 1.

FIG. 2 shows a circuit diagram associated with FIG. 1. One contact sequence is laid out between two SAA. SAA comprises sense amplifiers SA, precharge circuits PC for precharging the data lines to VDL/2, and IO gate circuits IOG for outputting data on the data lines to IO lines (IO0t, IO0b, IO1t and IO1b). Although not restricted in particular, SA is defined as a latch type sense amplifier including a P-type MISFET pair whose drains and gates are cross-connected and whose sources are commonly connected, and an N-type MISFET pair whose drains and gates are cross-connected and whose sources are connected in common. CSP and CSN indicate common source lines (sense amplifier drive lines) connected to the sources of the P-type MISFETs and N-type MISFETs of SA respectively. Further, FPC indicates a control signal for precharging the data line by each PC, VPLT indicates a plate potential of a memory cell capacitor, and VDL/2 is ½ of an array voltage at a data line precharge level. Each memory cell is a DRAM memory cell including one MISFET (NMOS in the figure) and a capacitor.

Figures 3A, 3B:
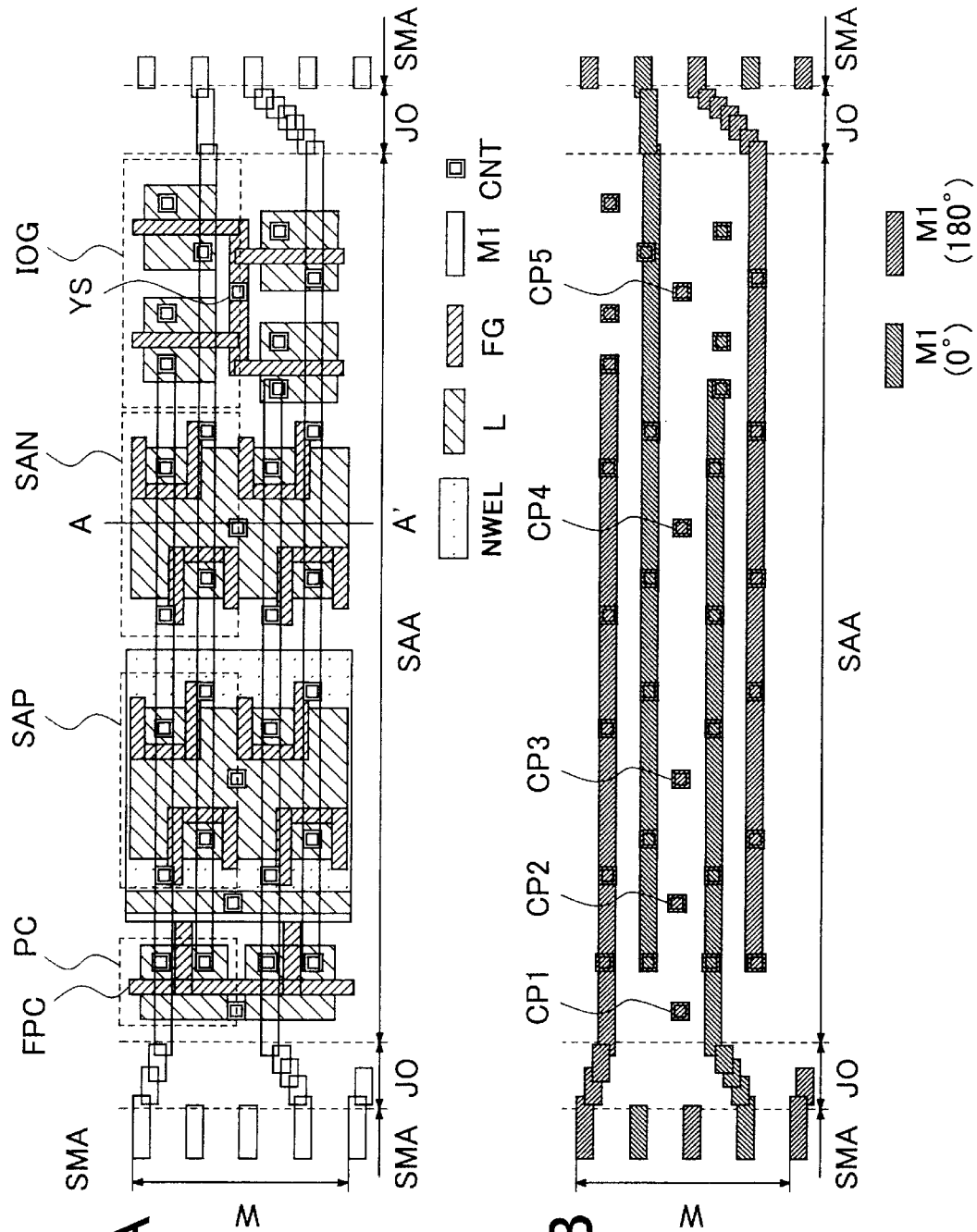
FIG. 3A shows mask patterns of FIG. 1.
FIG. 3B still shows mask patterns of FIG. 1.

FIG. 3 shows mask patterns about SA1 and SA2 indicative of the typical layout diagram of FIG. 1 more specifically. FIG. 3A is a layout diagram showing a diffused layer (L and NWEL), a gate layer (FG) and a first metal wiring layer (M1) simultaneously. SAP indicates a PMOS transistor section of a cross-coupled type amplifier circuit SA, and SAN indicates an NMOS section of SA. Each data line is formed in the first metal wiring layer (M1) above the gate layer FG. Incidentally, the gate layer (FG) is a layer comprised of polysilicon or the like which forms the gate of each MISFET. The gate of each MISFET in the sub memory array acts as a word line simultaneously.

On the other hand, FIG. 3B is a layout diagram showing only the first metal wiring layer in which the data lines in FIG. 3A are formed. CP1 through CP5 correspond to contact pads, respectively and play roles for performing relay or linkup for connecting to the diffused layer formed in a semiconductor substrate and a wiring layer above M1. The manner in which four data lines are placed in a width W in SMA, and patterns corresponding to five data lines are placed in SAA inclusive of a contact pad sequence, is well understood. According to FIG. 3B, it is understood that phase layouts or arrangements of the patters adjacent to one another are opposite in phase to one another even if any area of SMA, J0 and SAA is taken. The adjacent data lines are drawn from the memory array MA in opposite phase and the respective paired data lines are rendered reverse phase.

As a result, the layout of SAA becomes easy. Further, contacts for CSP, CSN, VDL/2 and YS corresponding to control and power lines of a sense amplifier circuit are placed between the two SAA in a row and shared therebetween. Thus, an advantage is brought about in that the data lines and the control/power lines can be laid out without switching between phase assignments to the data lines within the sense amplifier area. Incidentally, CSP, CSN and VDL/2 extend in the same direction as the word lines and are formed in a second metal wiring layer M2 above M1. Further, YS extend in the same direction as the data lines and are formed in a third metal-wiring layer M3, which is further above M2.

Figure 4:
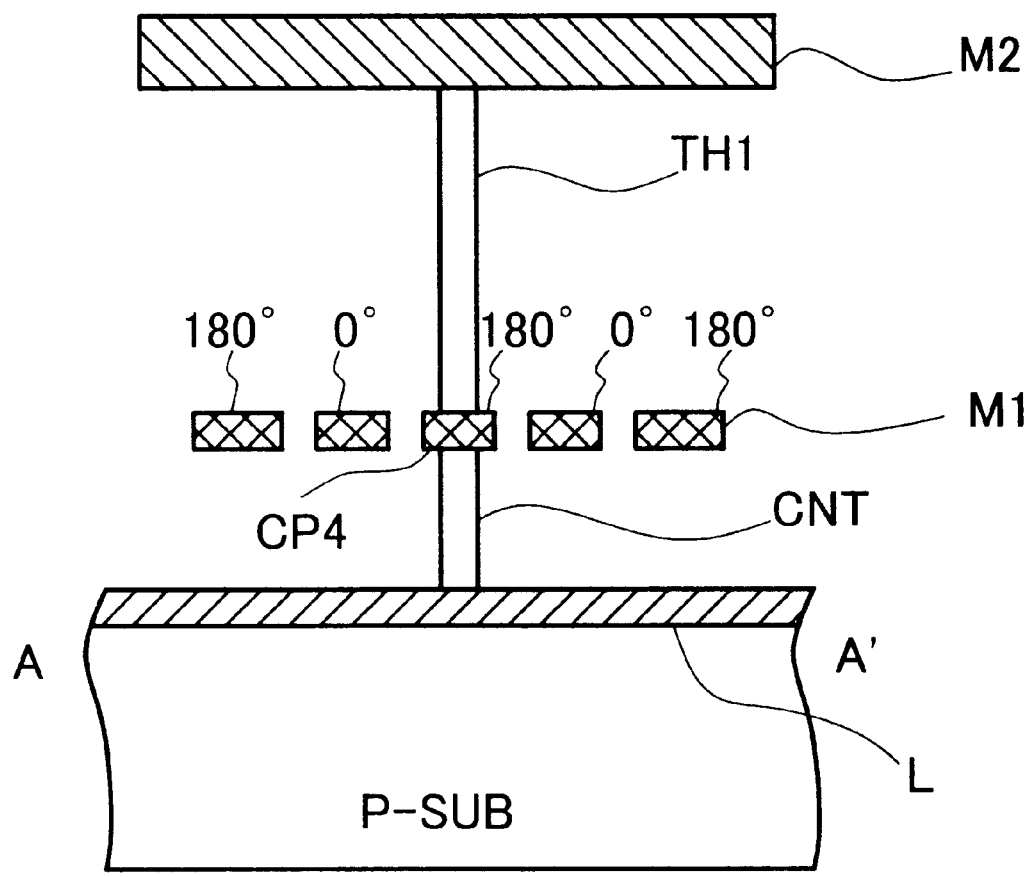
FIG. 4 is a cross-sectional view of a sense amplifier section shown in FIGS. 3A and 3B.

FIG. 4 is a cross-sectional view taken along line A–A' of the area for the N-type MISFET of the sense amplifier shown in FIG. 3A. In this figure, L indicates a diffused layer which serves as the drain and source of each transistor, FG indicates a transistor gate wiring layer, M1 indicates a first metal wiring layer, and M2 indicates a second metal wiring layer, respectively. CNT indicates a contact hole for connecting M1 and L or FG, and TH1 indicates a contact hole extending from M2 to M1. In the present embodiment, one control line or power line is wired within M1 lying in the same layer as the data lines for every two sense amplifier areas, and its phase layout is represented as 0°, 180°, 0°, . . . It is thus possible to prevent a short circuit in M1 wiring and between patterns within SAA.

Figure 5A:
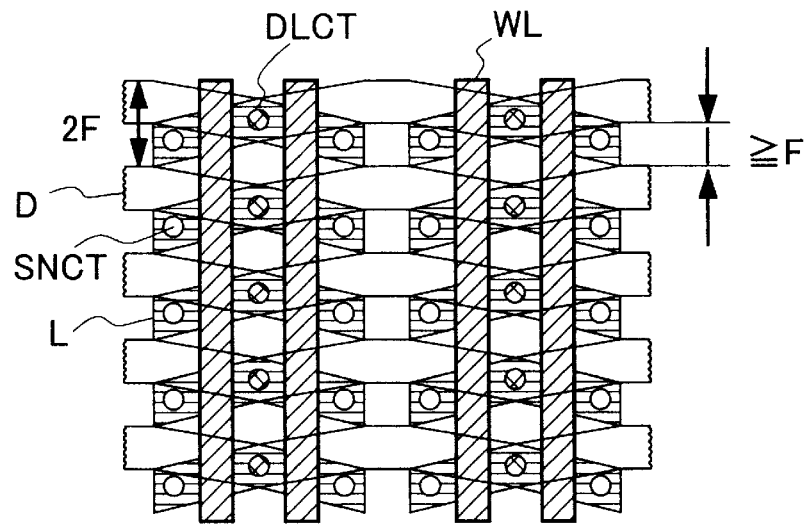
FIG. 5A illustrates mask patterns of a one intersecting-point memory array.
Figure 5B:
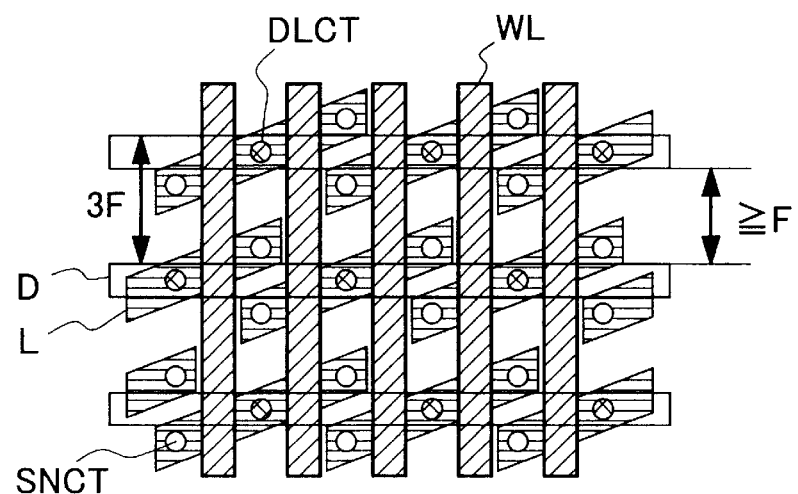
FIG. 5B still illustrates mask patterns of a one intersecting-point memory array.

FIG. 5 is a mask pattern diagram of a sub memory array SMA. This figure illustrates a one intersecting-point sub memory array having dynamic memory cells each set to a one-transistor one-capacitor configuration. Since one memory cell can theoretically be formed to six times the square of F, i.e., $6F^2$ in the one intersecting-point sub memory array, a large characteristic is obtained in that the memory array can be brought to high density. In the figure, D indicates data lines, WL indicates word lines, L indicates diffused layers for switch MISFETs of memory cells, DLCT indicates contacts for connecting the data lines and L, and SNCT indicates contacts for L and electrodes of capacitors of the memory cells. A source-to-drain path of each switch MISFET is formed between DLCT and SNCT. Incidentally, DLCT is shared between two memory cells adjacent to each other in the direction in which the data lines extend. In FIG. 5A, the pitch of each data line becomes 2F. Here, the width of the data line must be less than or equal to F to set the interval between the adjacent data lines to be greater than or equal to F. Further, the data line is not a perfect line and meanders. Incidentally, the pattern diagram itself of the one intersecting-point memory cell array shown in FIG. 5A has been described in FIG. 1 of [Reference 3]. On the other hand, the data-line pitch is relaxed and set to about 3F in FIG. 5B. Even in this case, the interval between the data lines must be greater than or equal to F. Incidentally, the pattern diagram itself of the one intersecting-point memory cell array shown in FIG. 5B has been described in FIG. 10 of [Reference 3]. In the embodiment shown in FIG. 1, although not restricted in particular, the adoption of the patterns, which make it satisfactory to separate between the data lines upon lithography, allows adaptation to the memory array in which the pitch of the data line in FIG. 5A reaches 2.5F or more, or allows adaptation to such a memory array as shown in FIG. 5B.

Operation and effects of the present invention at the above-described 4:5 layout or arrangement are as follows:

(1) In a memory cell array having an open data line arrangement and sense amplifiers, the shape or configuration of connections between the memory array and sense amplifiers which have allowed for micro-fabrication, has been revealed. Such a connected shape is characterized by patterns for connecting two data lines (e.g., *1 and *4) interposing two adjacent data lines (e.g., *2 and *3 in FIG. 1) therebetween to their corresponding adjacent two sense amplifiers (e.g., SA1 and SA2) in one memory array. Owing to the adoption of such connecting patterns, positive and negative phases can be assigned to their corresponding adjacent patterns without contradiction at the memory array, sense amplifiers and the connected portions between the memory array and the sense amplifiers. It is therefore possible to form data lines in a high resolution through the use of the phase shift method. This promotes the scale down of the semiconductor integrated circuit and contributes to an increase in the scale of a memory and a cost reduction in the memory.

(2) Owing to the adoption of the open data line arrangement, the area of one memory cell can be reduced to a minimum $6F^2$ and hence a reduction in the area of the memory array can be achieved.

(3) Owing to the provision of one contact pad sequence between two sense amplifiers, power wiring for the sense amplifiers, etc. can be formed according to a normal production process.

(4) Since a perfect self-reproduction type repetitive structure is provided, the extension of a memory array in which a plurality of sub memory arrays and sense amplifier blocks are arranged, is facilitated.

[1-3. 4:5 Arrangement (Part 2)]

Figure 6:
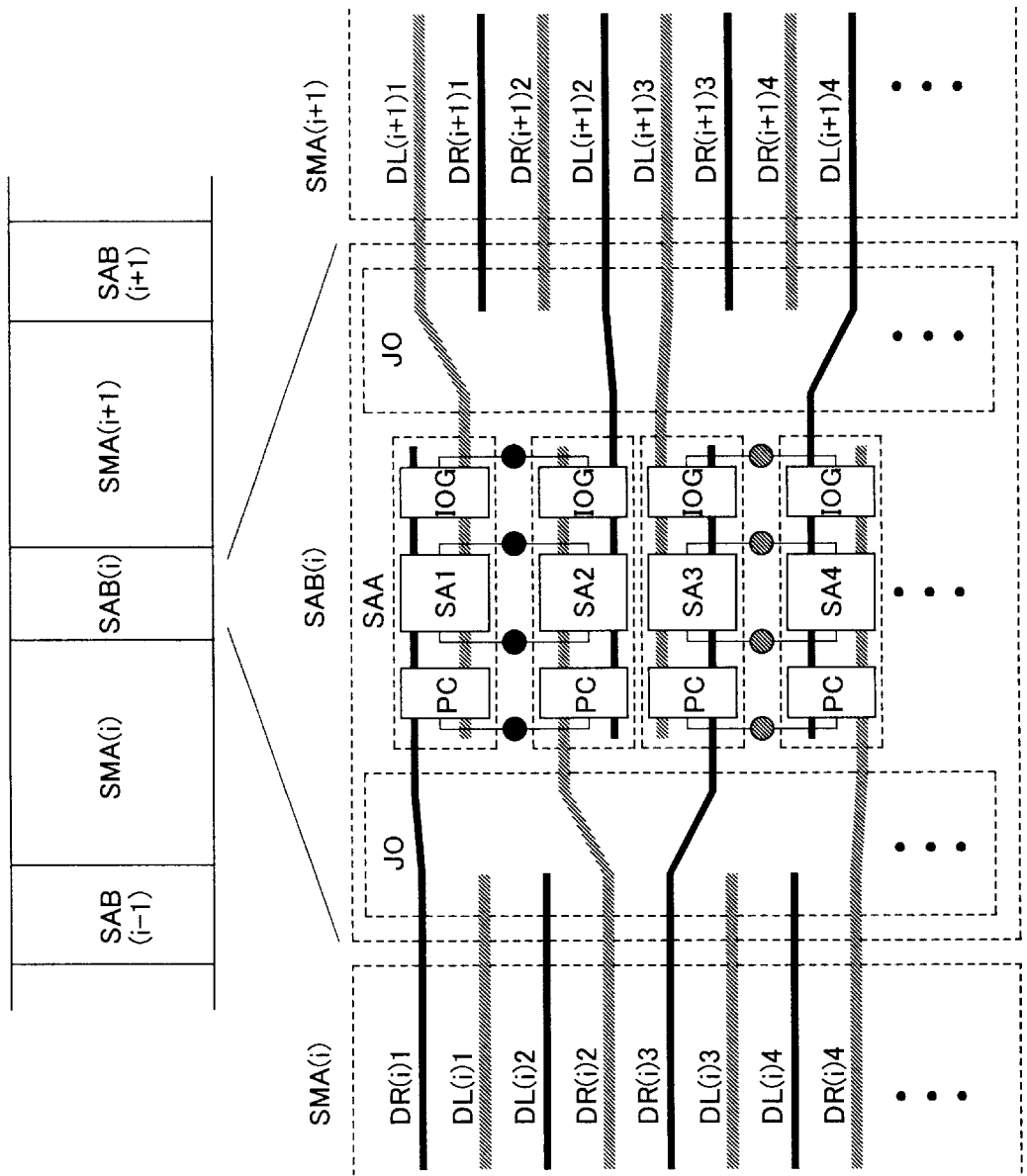
FIG. 6 is a connection layout showing the data lines employed in the first embodiment (4:5 arrangement (part 2))
Figure 7:
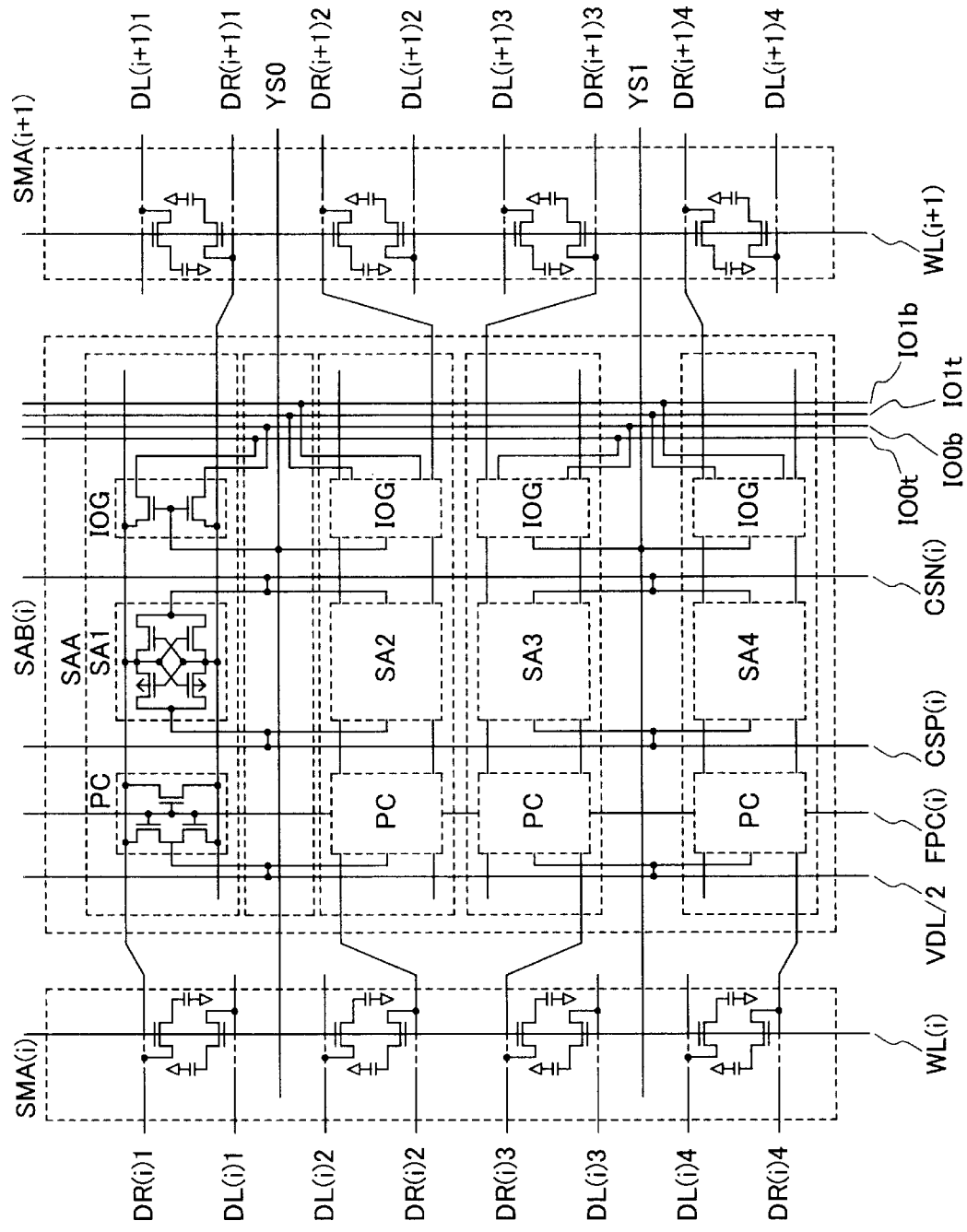
FIG. 7 is a circuit diagram of FIG. 6.

FIG. 6 shows a modification of FIG. 1. A circuit diagram corresponding to FIG. 6 is shown in FIG. 7. While mask patterns are omitted, modifying FIGS. 3A and 3B can easily form the mask patterns. A layout shown in FIG. 6 is identical to FIG. 1 in that the "4:5 arrangement" is adopted. However, phase assignments to data lines are reversed in adjacent sub memory arrays (SMA(i) and SMA(i+1)). Namely, as compared with FIG. 1, the layout shows the case in which a phase-reversal relationship is established between DR(i)1 and DL(i+1)1. Only the right side is different from the layout shown in FIG. 1 with SAB(j) interposed between SMA(i) and SMA(i+1).

In the layout shown in FIG. 6, a repetitive structure is not simple. A first repetitive layout is that those just the same to FIG. 6 are connected to the right side of SMA(i+1) with one data line being shifted below. A second repetitive layout results in combined patters of FIG. 6 and FIG. 1. First of all, the left side of FIG. 6 can simply be connected to the right side of FIG. 1. As patterns connected to the right side of FIG. 6, those obtained by interchanging the solid lines and broken lines in FIG. 1 are connected. The layout shown in FIG. 6 has the same operation and effects as the layout shown in FIG. 1 except that a sub-array repetitive structure becomes slightly complex as compared with FIG. 1. Further, the shape of connections between the data lines shown in FIG. 6 becomes precisely identical to FIG. 1 if attention is paid to the right side of.SAB(j). The characteristics of patterns are described in the same manner as FIG. 1.

Second Embodiment

[2-1. 4:4 Arrangement (Part 1)]

Figure 10:
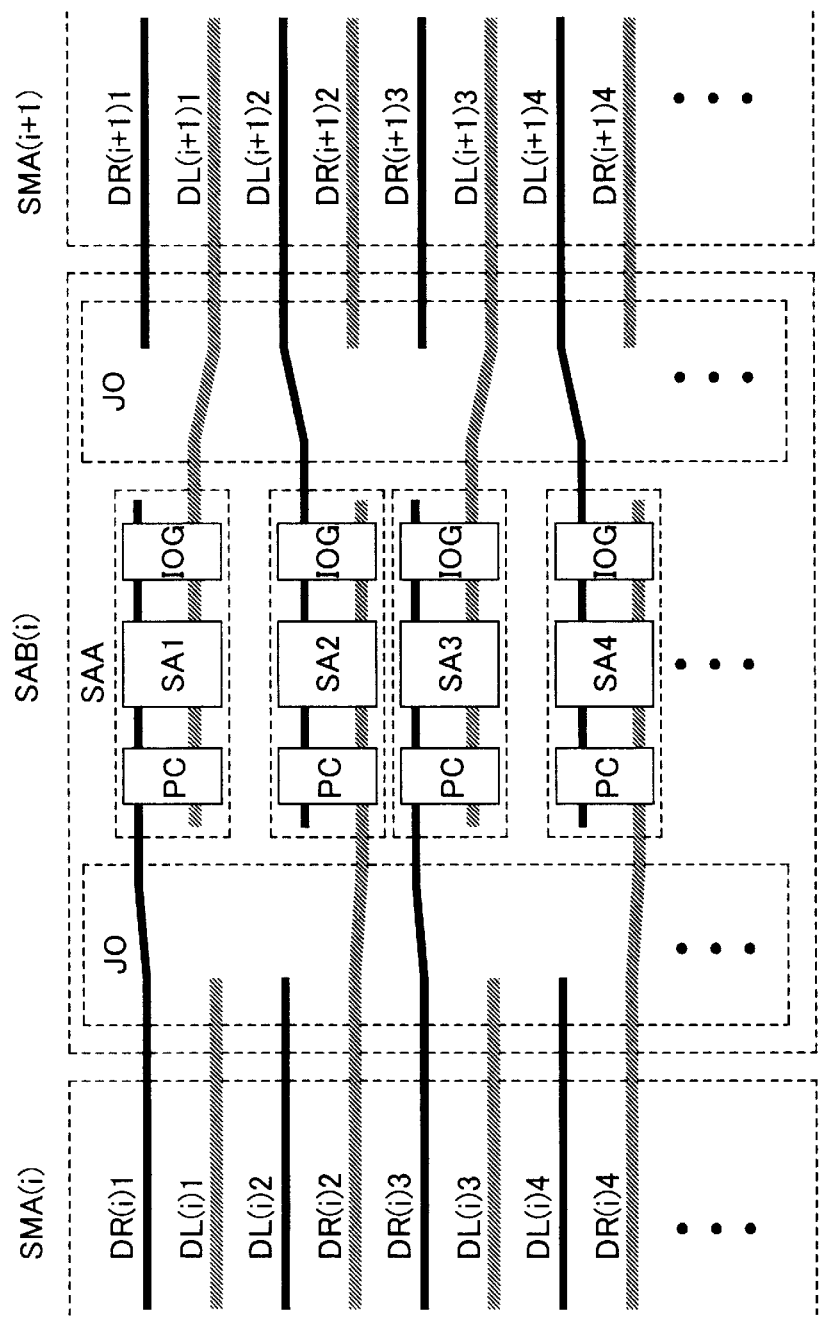
FIG. 10 is a connection layout showing data lines employed in a second embodiment (4:4 arrangement (part 1))

FIG. 10 shows phase assignments in a layout of sub memory arrays (SMA) and a sense amplifier block (SAB) employed in a second embodiment of the present invention. The second embodiment is characterized in that four data lines are placed in a predetermined width W within both SMA and SAB. Therefore, the layout shown in FIG. 10 is called "4:4 layout or arrangement". Namely, as compared with FIG. 1, no contact pad sequence is provided in a layer in which data lines are formed. Portions other than the contact pad sequence have configurations common to the first embodiment.

This layout has repeated patterns in an X direction with two sense amplifiers SA1 and SA2 as one group. In view of this point, the present layout has the advantage that the patterns are simplified as compared with FIG. 1. In SA1, a data line lying inside a sense amplifier and a data line for a sub memory array are simply connected to SA1. SA2 features that while a data line lying inside a sense amplifier and a data line for a sub memory array are simply connected thereto, the direction of its connection is opposite to SA1. The layout shown in FIG. 10 has a perfect self-reproduction structure with respect to a Y direction in a manner similar to FIG. 1.

Figure 12A:
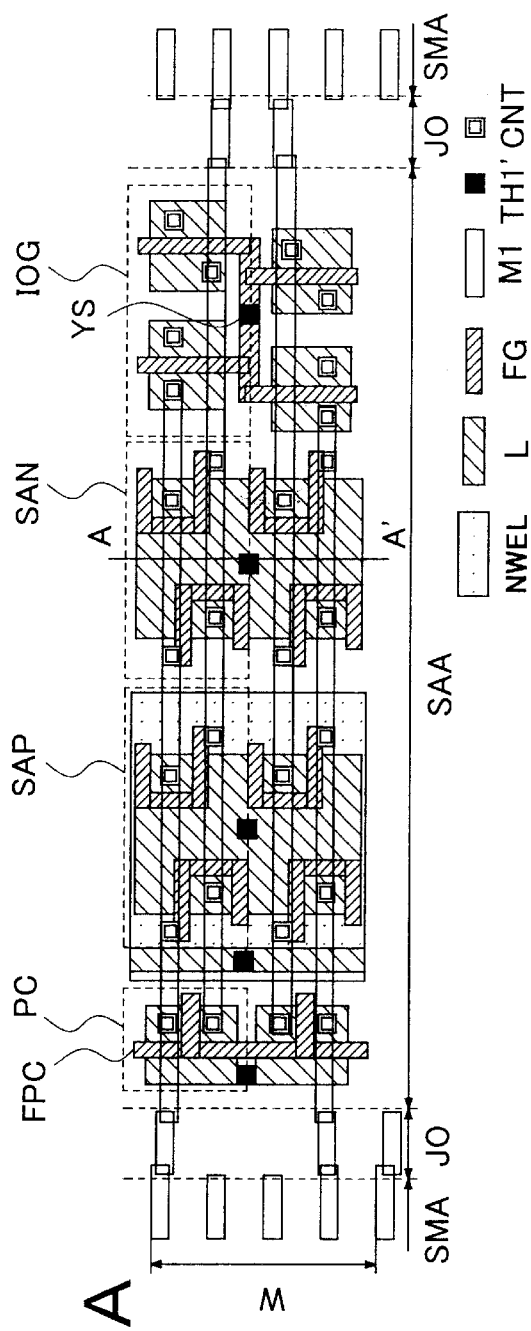
FIG. 12A shows mask patterns of FIG. 10.
Figure 12B:
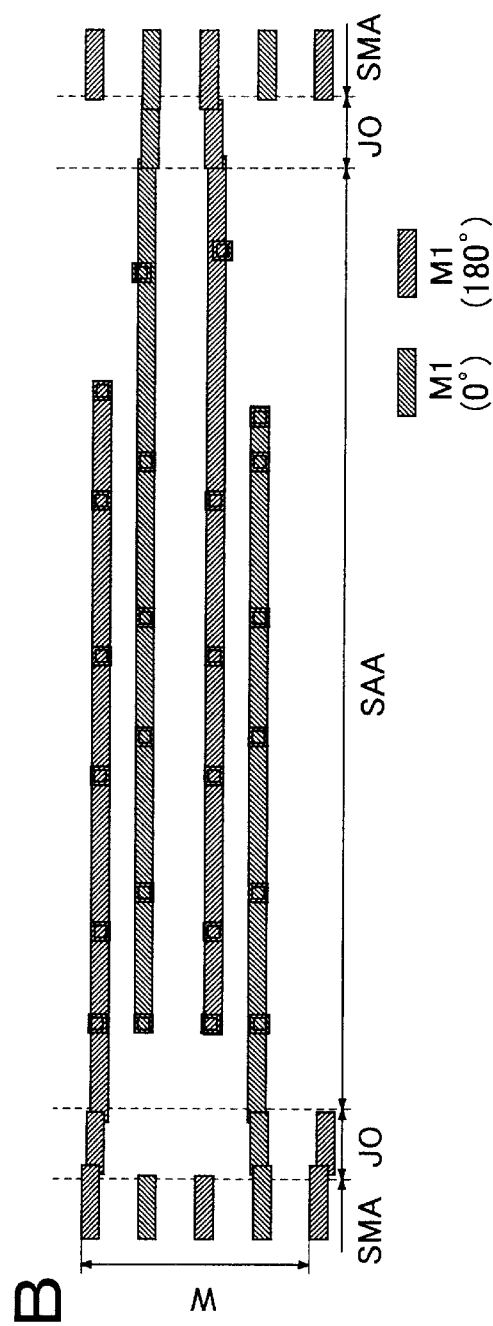
FIG. 12B still shows mask patterns of FIG. 10.

In the present embodiment, the patterns lying in the same layer (M1) as the data lines are not used within SAA except for the data lines. Such a layout is available where a structure in which contacts are defined in a gate wiring layer (FG) and a diffused layer (L) directly from layers (M2 and M3) above the data lines (M1) or without a pattern for M1, can be formed, or where the pattern for M1 is not required except for the data lines. FIG. 12 shows actual layout patterns corresponding to FIG. 10. As is understood from FIG. 12B, such contact pads as to disturb phase layouts or arrangements are not provided in a first metal wiring layer M1.

Figure 13:
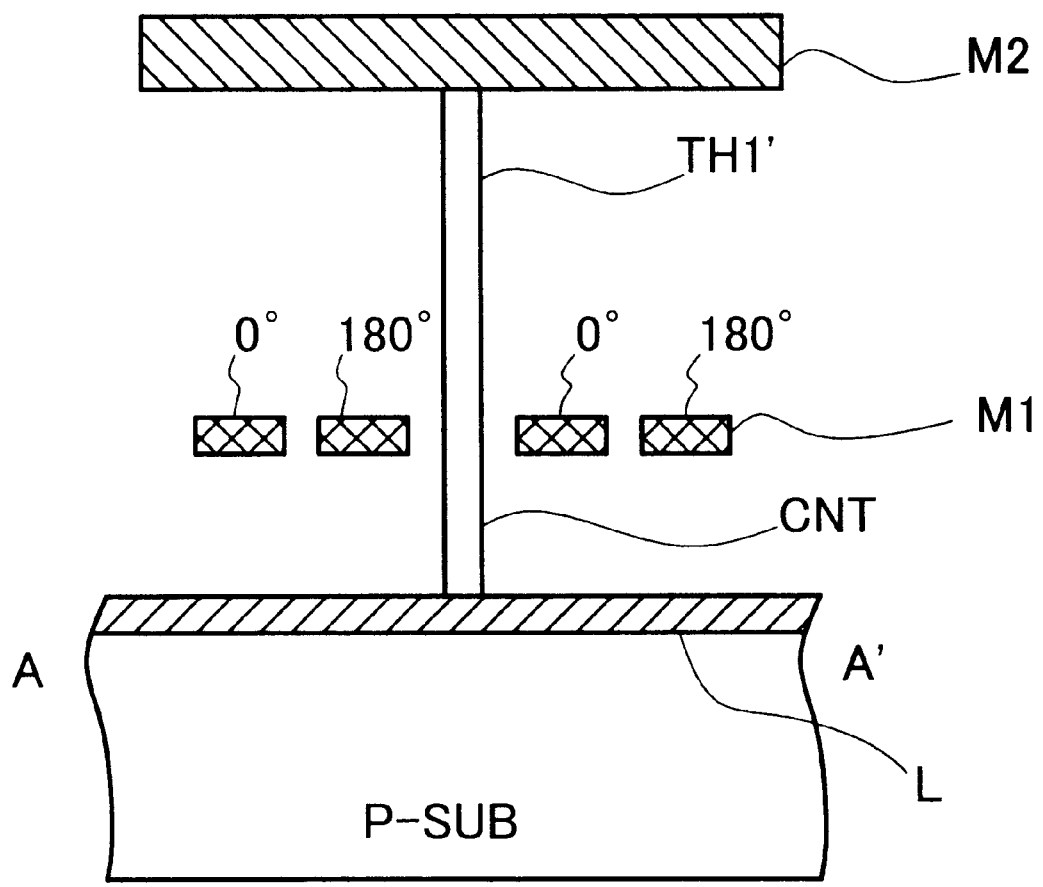
FIG. 13 is a cross-sectional view of a sense amplifier section shown in FIGS. 12A and 12B.

FIG. 13 shows a cross section taken along line A–A' in a portion of an N-type MISFET of the sense amplifier shown in FIG. 12. In FIG. 4, the structure has been adopted in which the contact is formed in the diffused layer L through the contact pad CP of M1 temporarily as viewed from M2. In the present embodiment contrary to this, a contact is directly made in a diffused layer L via a through hole TH1' as viewed from M2 above M1. Since the contact is made in L without the pattern for M1 as viewed from M2 in the layout shown in FIG. 10, the phase arrangements of M1 take simple repetition of 0° and 180° for every data lines even within SAA. As to the data lines in a manner similar to the first embodiment, two of four data lines continuously provided within SMA are connected to SAA drawn to SAB and adjacent to each other. The remaining two data lines are connected to adjacent SAA of a sense amplifier block (SAB(j−1) or SAB(j+1)) provided on the side opposite to each other with SMA(i) or SMA(i+1) interposed therebetween. In the present embodiment, an advantage is brought about in that since the number of data lines per SAA lying in the same layer (M1) as the data lines is two alone, the layout of SAA becomes an easy. Besides, the reverse phase setting of each data line allows a reduction in the space between the adjacent data lines.

The layout shown in FIG. 10 depends on the presence or absence of the technology of producing the through hole TH1' for connecting the two layers at a time as shown in FIG. 13. Namely, it is normally necessary to provide through holes TH1 for connecting M2 and M1 for other circuit portions. Therefore, two types of through holes different in depth, in which a through hole extends from M2 to L and a through hole extends from M2 to M1, become necessary. It is also necessary to form plugs which bury the through holes different in depth and perform connections via the through holes. Thus, the layout shown in FIG. 10 is effective for the case where such a through-hole forming technology can be used. If there are reversely circumstances that the through-hole forming technology for connecting the two layers at a time cannot be used, the layout shown in FIG. 1, which is the most common means, for example, can be adopted. While the layout shown in FIG. 10 as described above is different from the layout shown in FIG. 1 in that the through holes for connecting the two layers at a time are used, it is similar to that shown in FIG. 1 in point of basic operation and effects. Further, the connected shapes of the data lines in FIG. 10 can define characteristic connection patterns in a manner similar to FIG. 1 if attention is given to the right side of SAB(j). FIGS. 1 and 10 are different from each other in that the connections of the data lines within SA2 are opposite to each other. Further, since the four data lines are placed in the predetermined width W within both SMA and SAB, the embodiment shown in FIG. 10 can cope with the memory array, in which the pitch of each data line shown in FIG. 5A reaches greater than or equal to 2F, and cope with such a memory array as shown in FIG. 5B although not restricted in particular.

[2- 2. 4:4 Arrangement (Part 2)]

Figure 11:
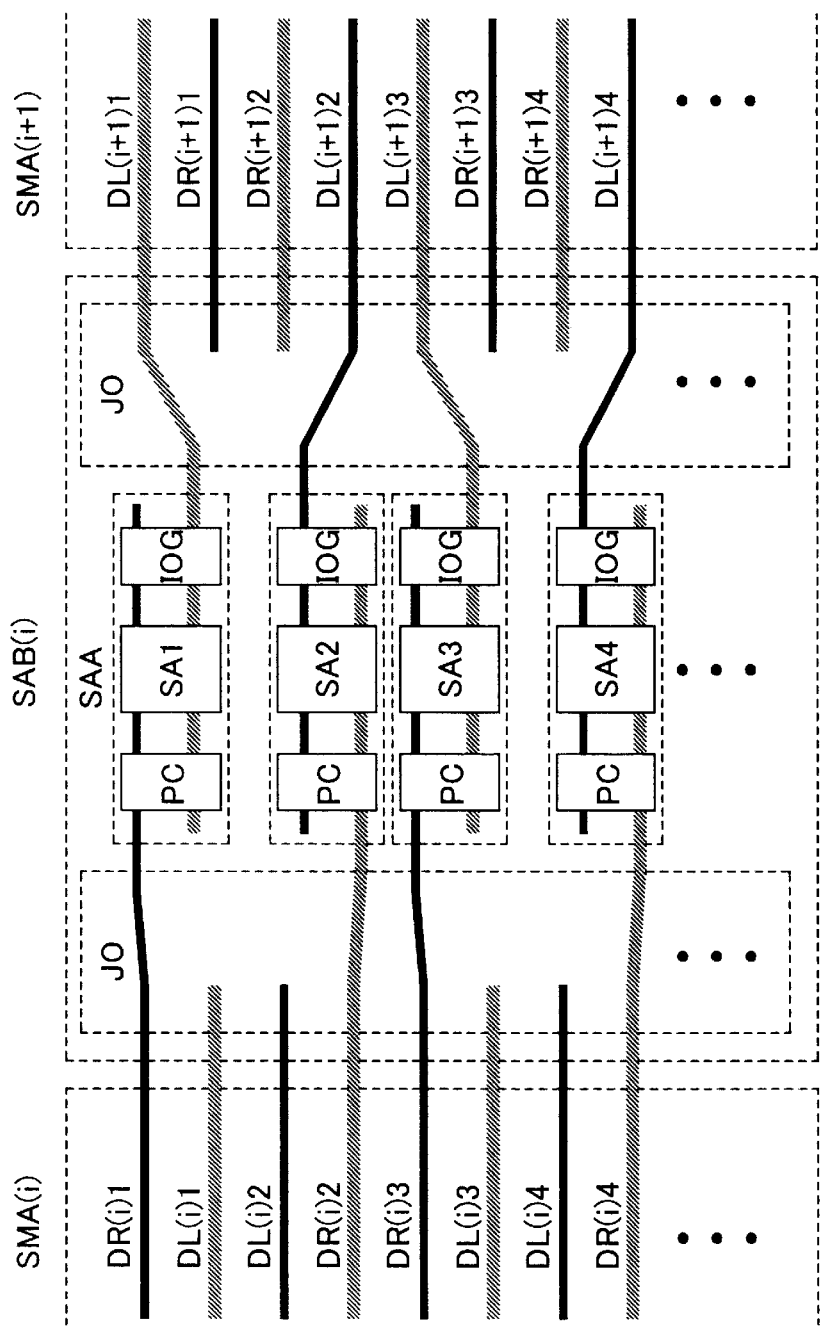
FIG. 11 is a connection layout depicting the data lines employed in the second embodiment (4:4 arrangement (part 2))

FIG. 11 shows a modification of the layout shown in FIG. 10. FIG. 11 has been derived from FIG. 10 in a manner similar to the method of modifying FIG. 1 for FIG. 6. Namely, FIG. 11 shows the case where phase assignments of data lines are reversed in sub memory arrays (SMA(i) and SMA(i+1)) adjacent to each other (DR(i)1 and DL(i+1)1 are opposite in phase). The difference between FIG. 10 and FIG. 11 resides in that SAA is interposed between the sub memory arrays and only the right side is different each other.

Even in the case of the layout shown in FIG. 11, two types are considered as continuous repetitive structures of sub memory arrays SMA and sense amplifier blocks SAB in a manner similar to the layout shown in FIG. 6. Namely, they include a first repetition layout or arrangement in which the pattern itself of FIG. 11 is kept down by one data line and which is connected to the right side of SMA(i+1), and a second repetition layout or arrangement in which the layout shown in FIG. 10 and the layout shown in FIG. 11 are combined together. Thus, the layout shown in FIG. 11 has the same operation and effects as the layout shown in FIG. 10 except that the repetitive structure of sub arrays becomes slightly complex as compared with FIG. 10.

Third Embodiment

[3- 1. 4:6 Arrangement (Part 1)]

Figure 14:
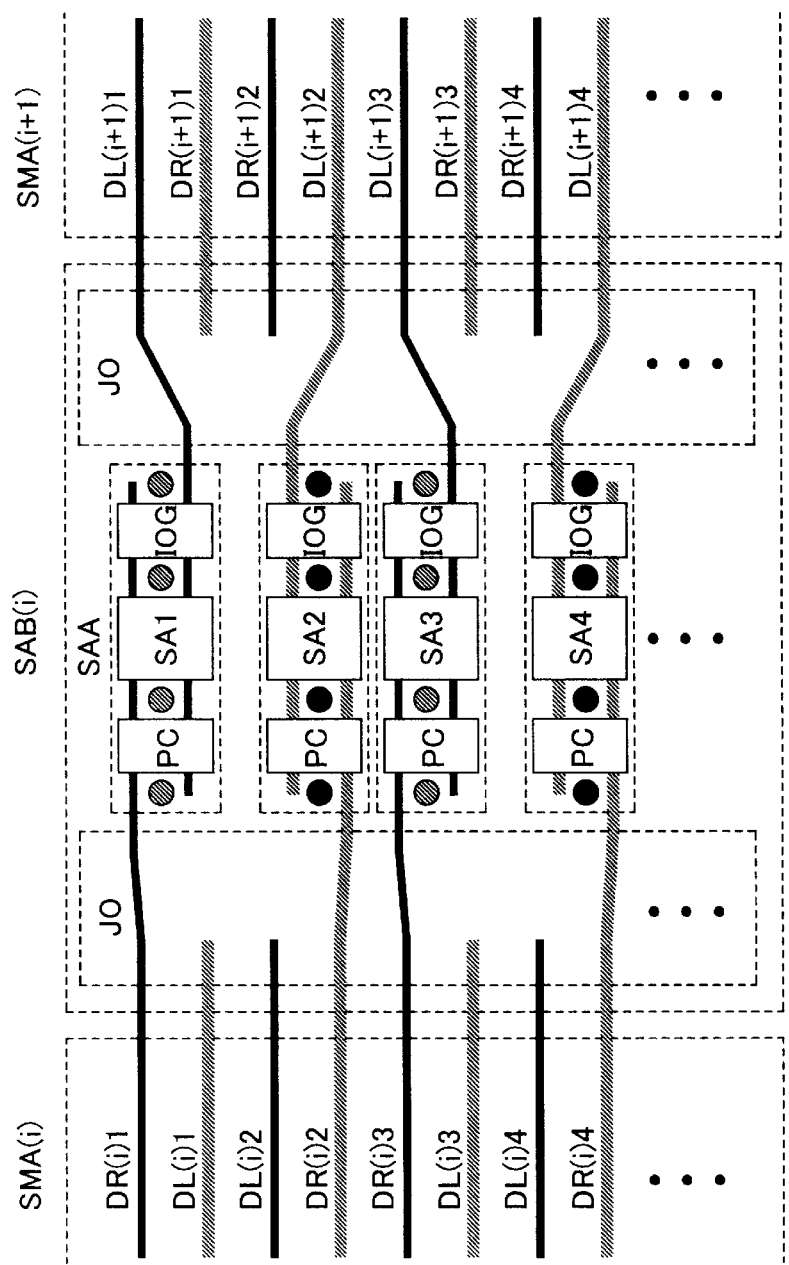
FIG. 14 is a connection layout showing data lines employed in a third embodiment (4:6 arrangement (part 1))

FIG. 14 shows the layout of sub memory arrays (SMA) and a sense amplifier block (SAB) employed in a third embodiment of the present invention and the placement of their phase assignments. This figure is characterized in that four data lines are placed in a predetermined width W within SMA and six (four data lines and two sequences of contact pads) data lines are substantially placed in a predetermined width W within SAB. Therefore, the layout shown in FIG. 14 is called "4:6 layout or arrangement". Other portions have configurations common to the first embodiment. This layout has repeated patterns with two sense amplifiers SA1 and SA2 as one group as viewed in an X direction. In each of SA1 and SA2, data lines lying inside the sense amplifiers and data lines for sub memory arrays are simply connected to one another on the left side, whereas they are connected with twists on the right side. The layout shown in FIG. 14 has a perfect self-reproduction structure as viewed in a Y direction in a manner similar to FIG. 1.

Figure 17:
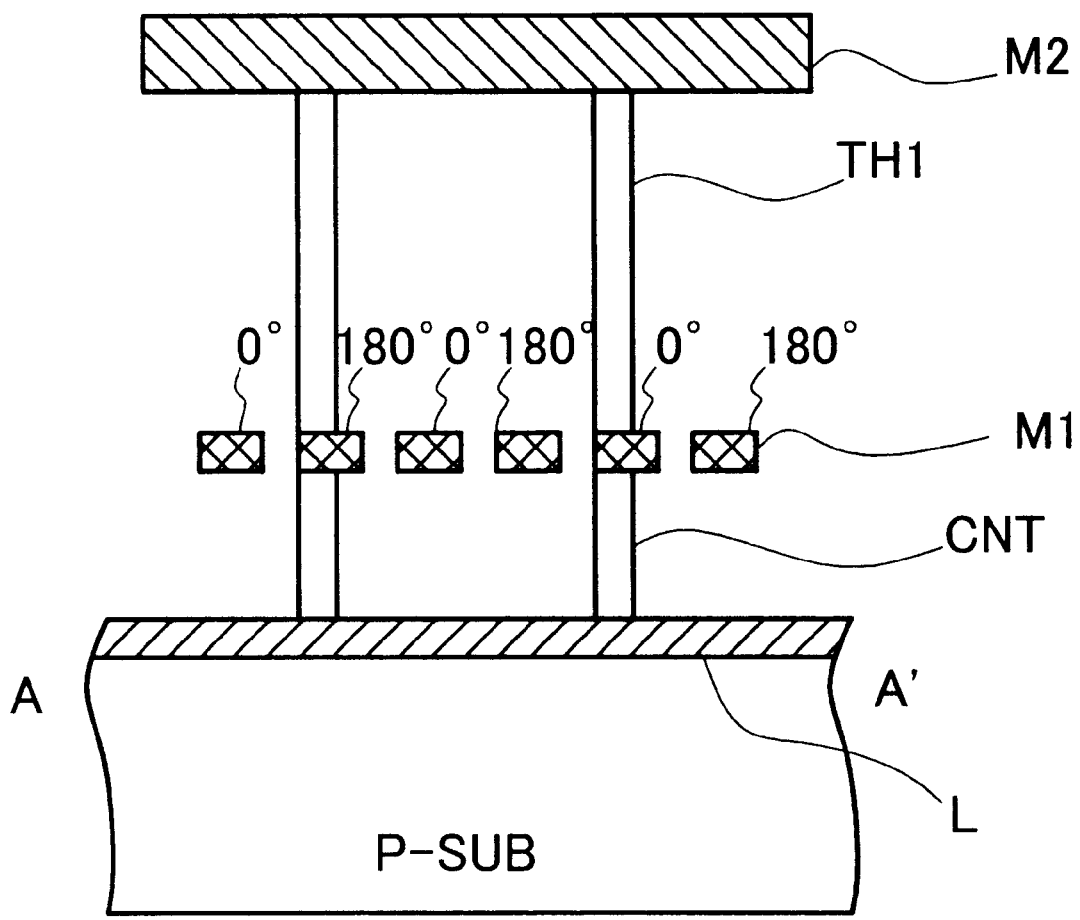
FIG. 17 is a cross-sectional view of a sense amplifier section shown in FIGS. 16A and 16B.

FIGS. 16A and 16B shows mask patterns of FIG. 14. Data line pairs, and contacts for power and control lines or the like between the data line pairs are formed in a first wiring layer M1. FIG. 17 is a cross-sectional configuration diagram taken along line B–B' of FIG. 16A. As to the data lines in a manner similar to the first embodiment, the two of the four data lines continuously provided within SMA are drawn to SAB and connected to adjacent SAA. The remaining two are connected to adjacent SAA of a sense amplifier block (SAB(j−1) or SAB(j+1)) provided on the opposite side with SMA(i) or SMA(i+1) interposed therebetween. The present embodiment has an advantage in that since the contacts for the power and control lines are provided between the data lines for every SAA, phase assignments to the data lines are in phase and a variation in post-exposure wiring width due to the difference between 0° and 180° upon lithography can be lessened. In a manner similar to the first and second embodiments, the present embodiment also has an advantage in that since adjacent data lines are opposite in phase in a connection area J0 between the sub memory array (SMA) and the sense amplifier block (SAB), a layout shown in FIGS. 16A and 16B becomes easy. A circuit configuration formed within SAA is similar to FIG. 2. There are provided such wirings that phase arrangements or layouts of the adjacent M1 layers are always opposite in phase. The configuration of SMA is identical to FIG. 6.

[3-2. 4:6 Arrangement (Part 2)]

Figure 15:
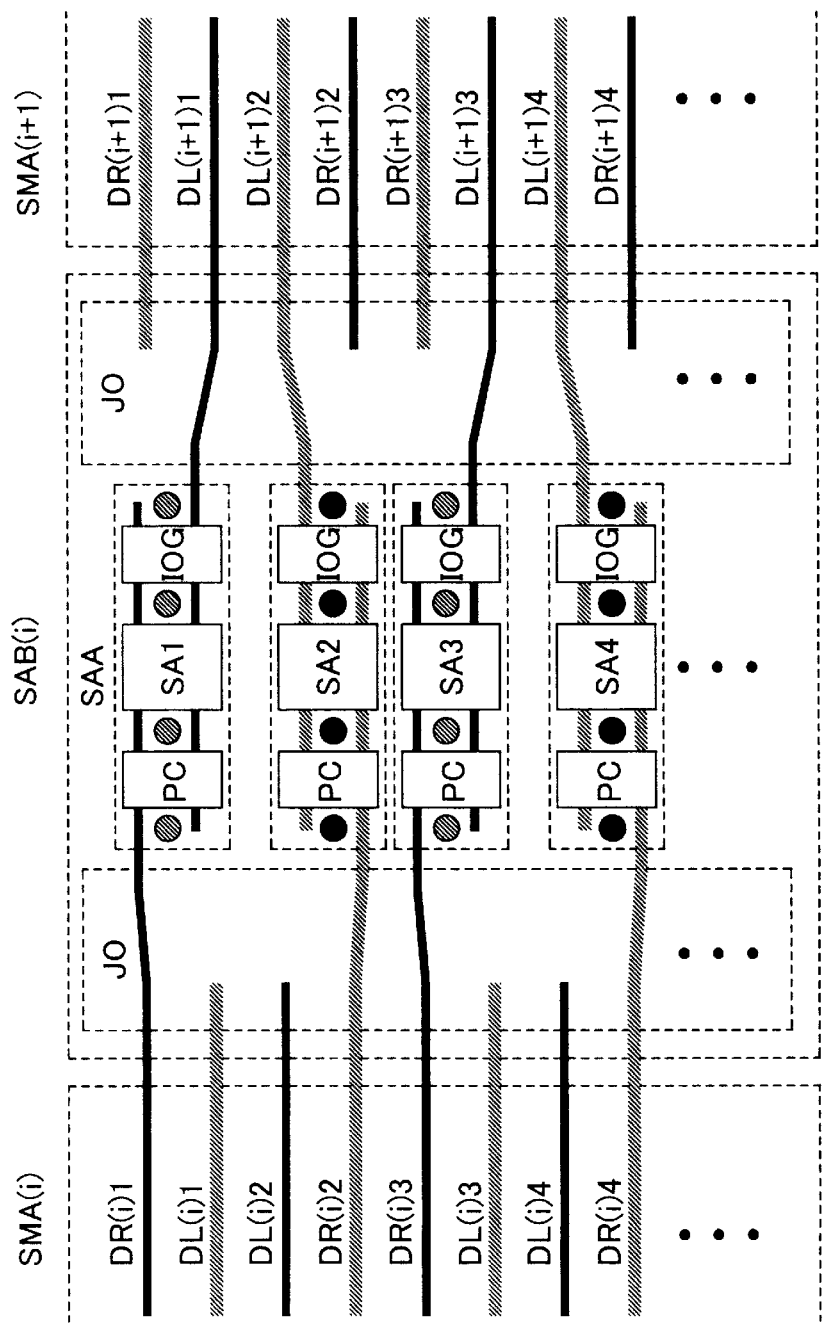
FIG. 15 is a connection layout illustrating the data lines employed in the third embodiment (4:6 arrangement (part 2)

FIG. 15 shows a modification wherein in the layout shown in FIG. 14, phase assignments to data lines are reversed in adjacent sub memory arrays. Assuming that an in-SAA layout is similar to FIG. 14, layout patters of data lines drawn from SMA(i+1) are opposite to the layout shown in FIG. 14 to make the same phase relationship between the data lines connected to SAB (j) through SMA(i) and SMA (i+1). A layout shown in FIG. 15 is similar to FIG. 1 in point of a sub-array repetition structure and has the same operation and effects as the layout shown in FIG. 14.

[3-3. 4:6 Arrangement (Part 3)]

Figure 18:
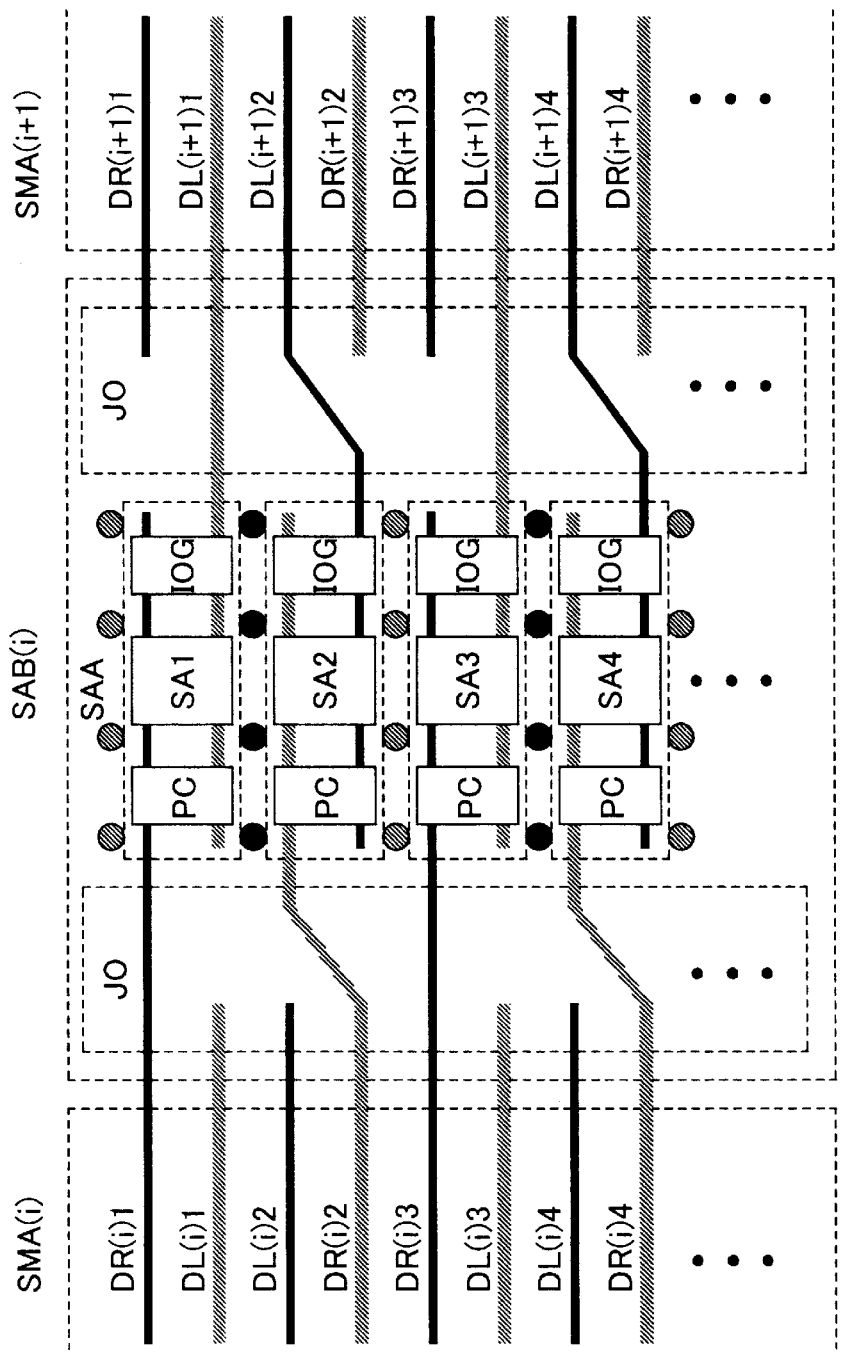
FIG. 18 is a connection layout illustrating the data lines employed in the third embodiment (4:6 arrangement (part 3))

FIG. 18 shows a modification of the layout of FIG. 14, which is an illustration of basic patterns based on a "4:6 layout or arrangement". In FIG. 14, each contact pad sequence was provided between the adjacent data lines in one sense amplifier. On the other hand, FIG. 18 is different from FIG. 14 in that contact pad sequences are provided between respective two adjacent sense amplifiers (between SA1 and SA2 and between SA2 and SA3, for example). An advantage is obtained in that since the contact pattern is placed between SAA in FIG. 18, the coupling between the sense amplifiers is reduced. Incidentally, FIG. 18 is identical to FIG. 1 in terms of connection patterns for data lines in SMA and SAB and phase arrangements except that the contact pad sequence is placed between the adjacent two sense amplifiers. Thus, the operation and effects of the layout shown in FIG. 18 are identical to FIG. 1 except that the two contact pad sequences are provided.

[3-4. 4:6 Arrangement (Part 4)]

Figure 19:
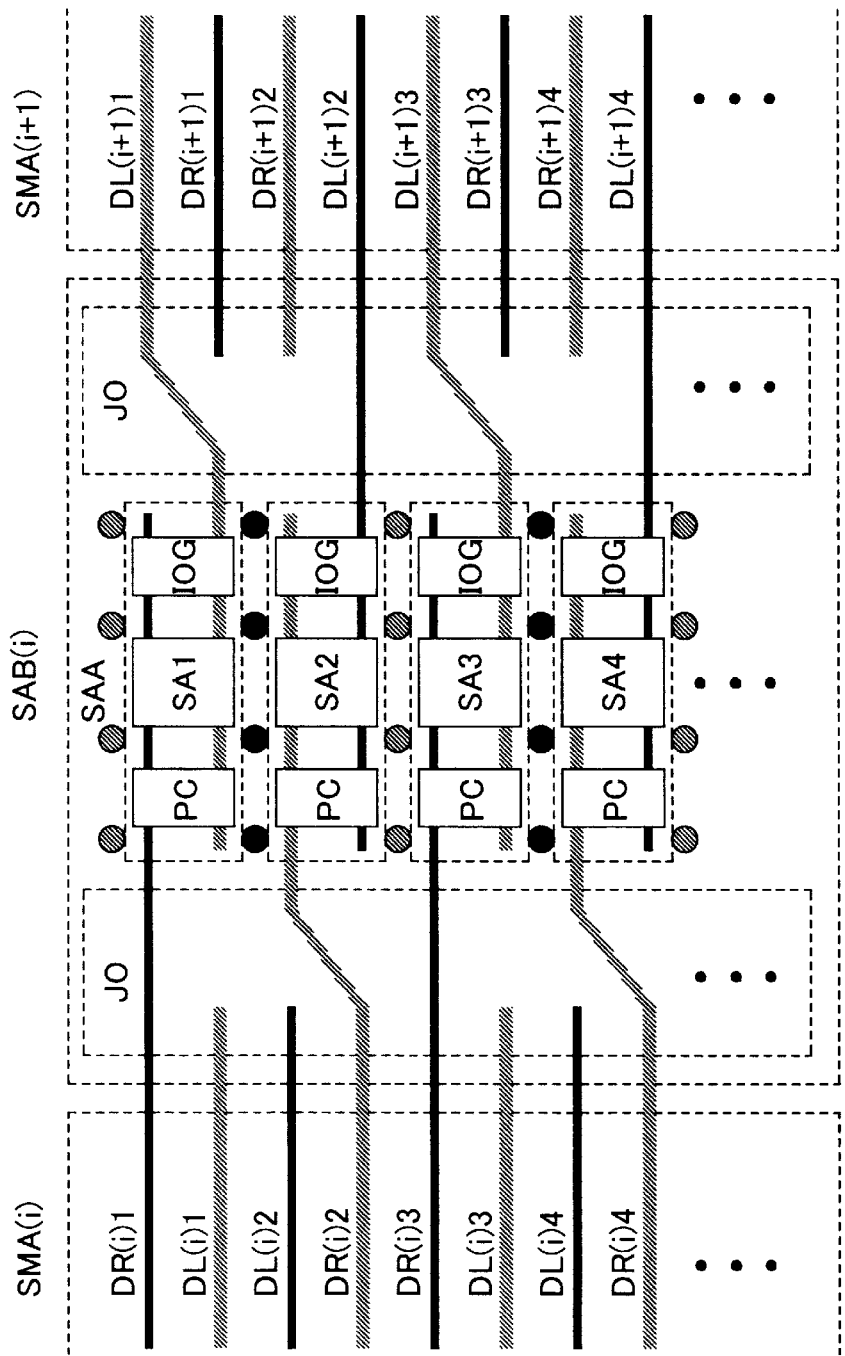
FIG. 19 is a connection layout showing the data lines employed in the third embodiment (4:6 arrangement (part 4))

FIG. 19 shows a modification wherein in the layout shown in FIG. 18, phase assignments to data lines are reversed in adjacent sub memory arrays. The present-embodiment illustrates a case in which phase assignments for data lines are reversed in adjacent sub memory arrays where in one sense amplifier area (SAA), one pattern such as a contact exists in the same layer as each data line. In FIG. 19 in a similar to FIG. 18, an advantage is obtained in that since a contact sequence is placed between SAA within SAB, the coupling between adjacent sense amplifiers is reduced. Assuming that an in-SAA layout is similar to FIG. 18, layout patters of data lines drawn from SMA(i+1) are opposite to a fourth embodiment to make the same phase relationship between the data lines connected to SAB(j) through SMA(i) and SMA(i+1).

Fourth Embodiment

The first through third embodiments have described the layout having as the characteristic part, the connection of the two data lines (e.g., *1 and *4) interposing the two adjacent data lines (e.g., *2 and *3 in FIG. 1) therebetween to the adjacent two sense amplifiers (e.g., SA1 and SA2) in one memory array. In the fourth embodiment, a description will be made of a layout in which data lines are selected so as to skip one data line (e.g., *1 and *3) and connected to adjacent two sense amplifiers SA.

[4-1. 4:5 Arrangement in Which Data Lines are Connected so as to Skip One Data Line]

Figure 20:
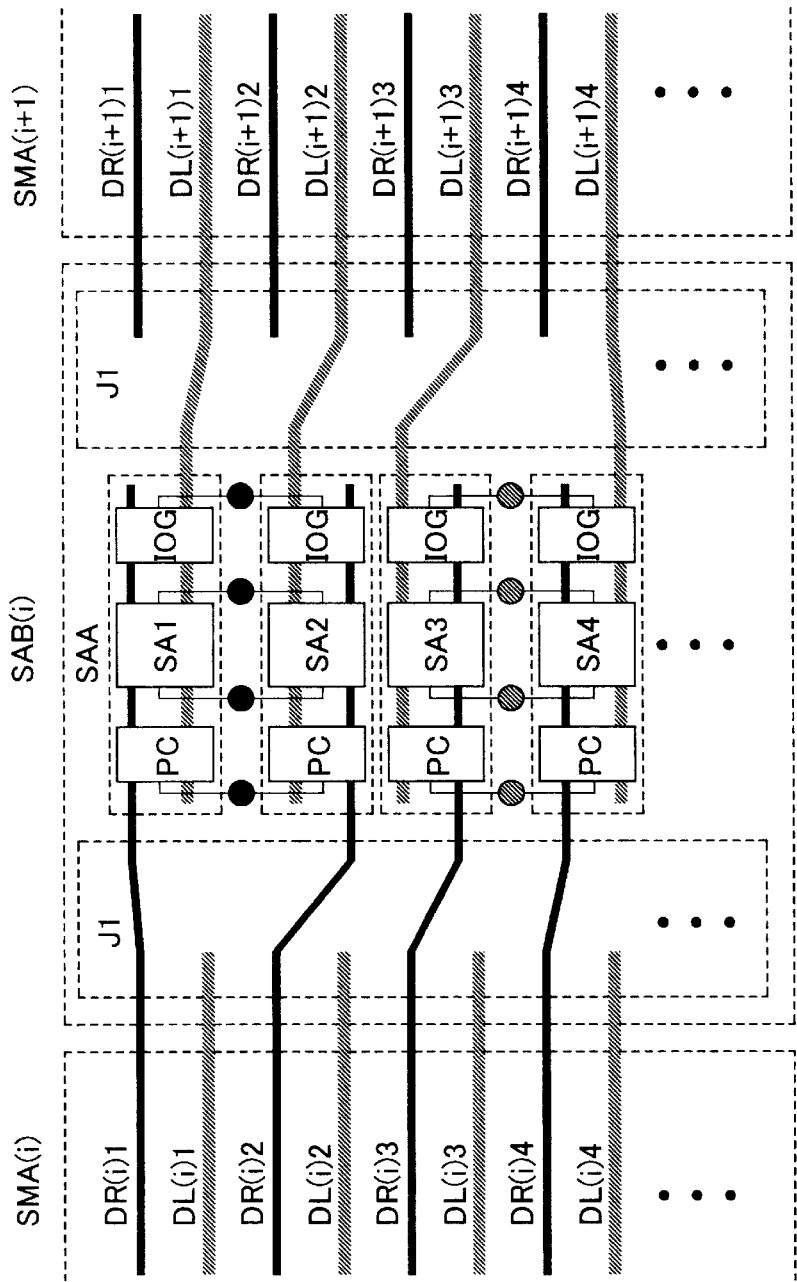
FIG. 20 is a connection layout illustrating data lines employed in the fourth embodiment (4:5 arrangement)

FIG. 20 shows a layout according to the fourth embodiment of the present invention. As compared with FIG. 1 illustrative of the first embodiment, the present layout is identical to FIG. 1 in that the "4:5 layout or arrangement" is adopted, but is different therefrom in that data lines extending from a memory array are connected to their corresponding sense amplifiers on alternate data lines in a connection unit J1. The present layout has repeated patterns with four sense amplifiers SA1 to SA4 as one group as viewed in an X direction. Data lines lying inside sense amplifiers and data lines in sub memory arrays are simply connected to SA1 and SA4. On the other hand, SA2 and SA3 are characterized in that data lines lying inside sense amplifiers and data lines in sub memory arrays are connected to one another with twists. Further, since the layout shown in FIG. 20 has a perfect self-reproduction structure with respect to a Y direction in a manner similar to FIG. 1, the expansion of the memory array is easy.

While phase arrangements at the time that phase shift lithography is used, are drawn by solid and broken lines in FIG. 20, data lines (e.g., DR(i)1 and DR(i)2) adjacent to each other in the connection unit J1 are identical to each other in phase. It is thus desirable to make allowance for the interval between the adjacent data lines in the connection unit J1. Therefore, the invention according to the layout shown in FIG. 20 allows the formation of further satisfactory data lines in the case of a combination with the memory array in which the pitch between the data lines shown in FIG. 5B reaches three times (3F) the minimum feature size F.

According to the layout shown in FIG. 20, an advantage is brought about in that the data lines are configured to be alternately charged and discharged in the memory array of the data lines, which is set as the reference side, and noise produced in the coupling between the data lines at their amplification can be lessened. This will be described with respect to SMA(i+1) at the time that SMA(i) is activated. When SMA(i) is activated, half of data lines connected to SAB(j) and SAB(j+1), of SMA(i-1) and SMA(i+1), are charged and discharged. Namely, while data lines DL(i+1)1, DL(i+1)2, DL(i+1)3, DL(i+1)4, . . . are charged and discharged, a shielding effect is obtained because data lines DR(i+1)1, DR(i+1)2, DR(i+1)3, DR(i+1)4, . . . are interposed between these data lines one by one. Further, coupling capacitance between the respective adjacent amplified data lines DL(i+1)1, DL(i+1)2, DL(i+1)3, DL(i+1)4, . . . becomes small, whereby the noise is reduced.

[4-2. 4:4 Arrangement in Which Data Lines are Connected One by One]

Figure 21:
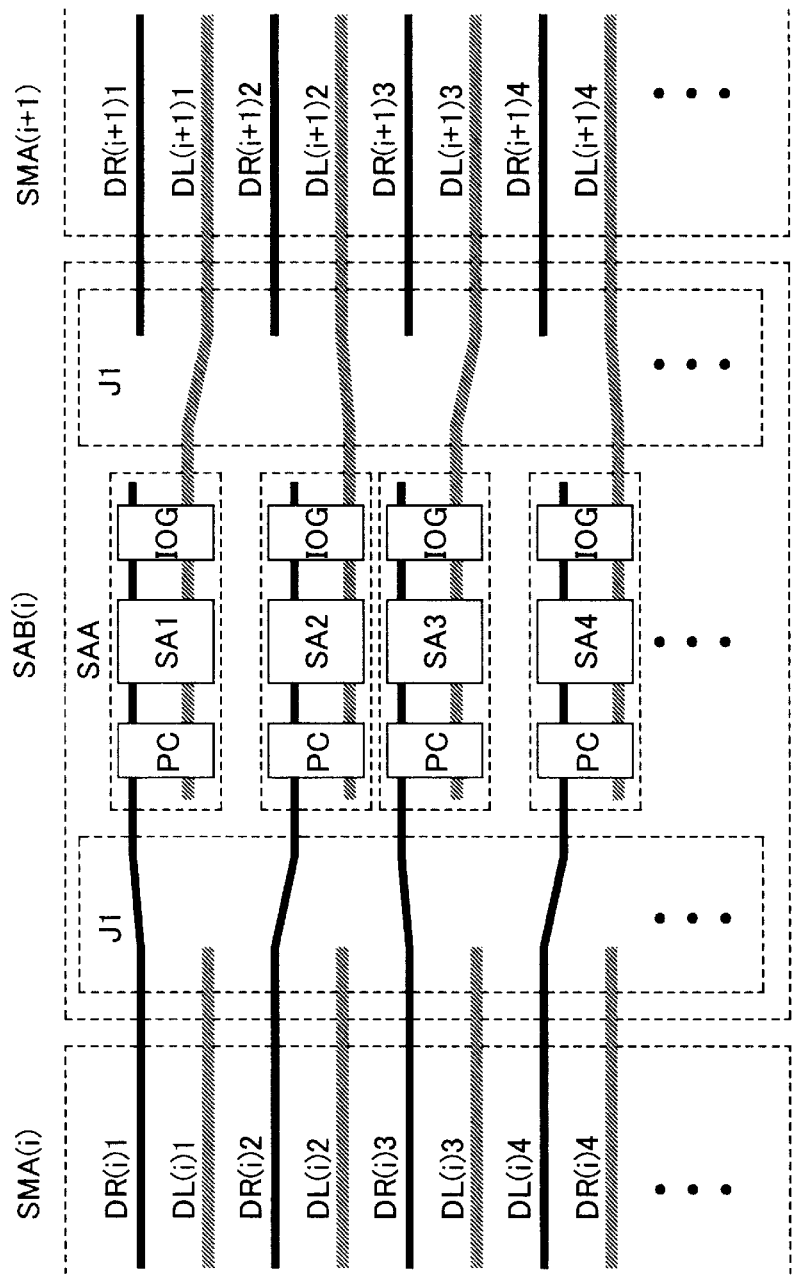
FIG. 21 is a connection layout showing the data lines employed in the fourth embodiment (4:4 arrangement))

FIG. 21 shows an example in which the way of concept identical to FIG. 20 is applied to the "4:4 arrangement" layout shown in FIG. 10. This layout has repeated patterns with two sense amplifiers SA1 and SA2 as one group as viewed in an X direction. Data lines lying inside sense amplifiers and data lines in sub memory arrays are simply connected to SA1 and SA2. Further, the present layout has a perfect self-reproduction structure in a manner similar to FIG. 1 with respect to a Y direction.

Since the adjacent data lines are in phase in the connection unit J1, the present layout is also good in compatibility with a combination with a memory cell array in which the interval between the data lines in FIG. 5B becomes 3F. Even in FIG. 21, an advantage is brought about in that the data lines are configured to be alternately charged and discharged in the memory array of the data lines, which is provided as the reference side, and noise produced in the coupling between the data lines at their amplification can be lessened. The present embodiment corresponds to a case in which patterns other than the data lines are not required within the same layer as the data lines in SAA. A process similar to the second embodiment can realize this embodiment. According to this process, the layout of the same layer (M1) as the data lines in the SAA becomes easy.

[4-3. 4:6 Arrangement in Which Data Lines are Connected for Each Line]

Figure 22:
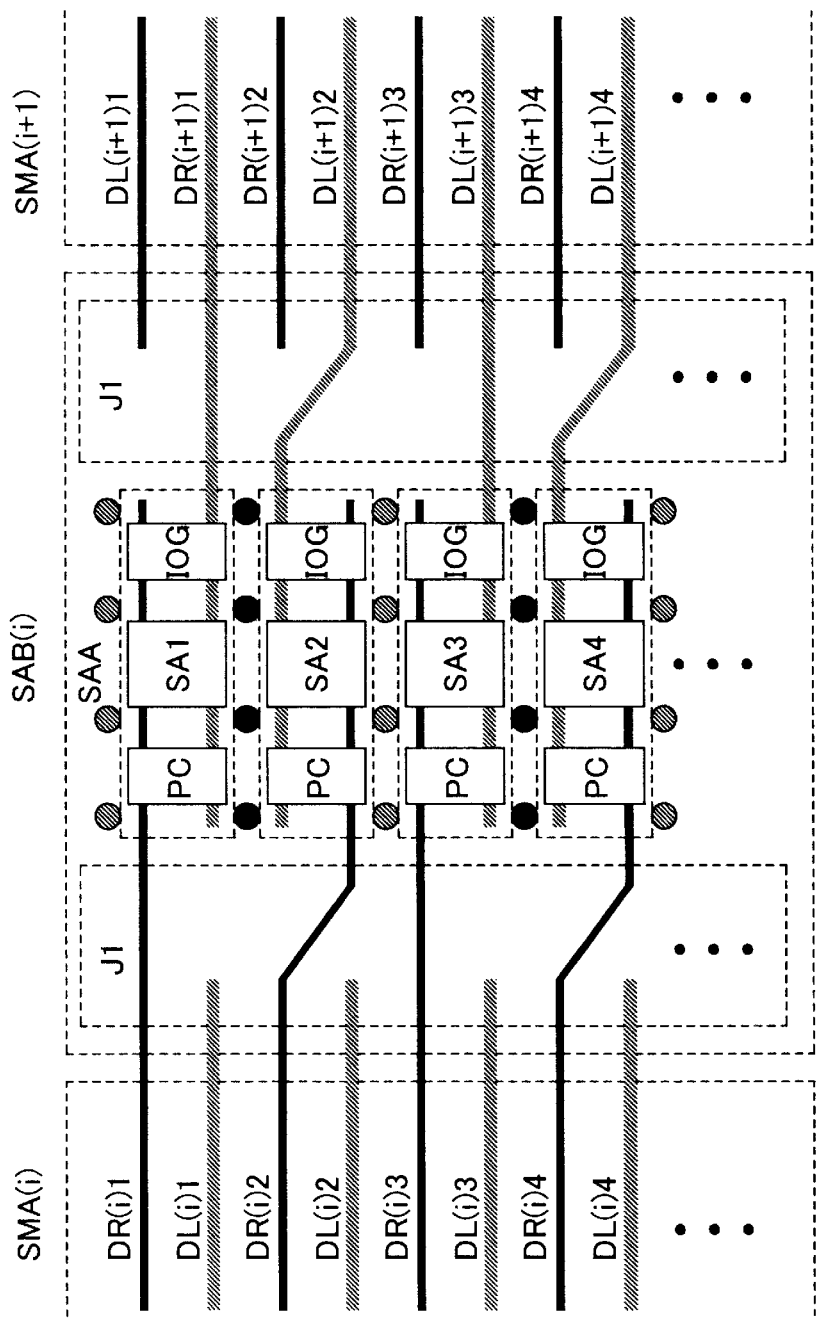
FIG. 22 is a connection layout depicting the data lines employed in the fourth embodiment (4:6 arrangement))
Figure 23:
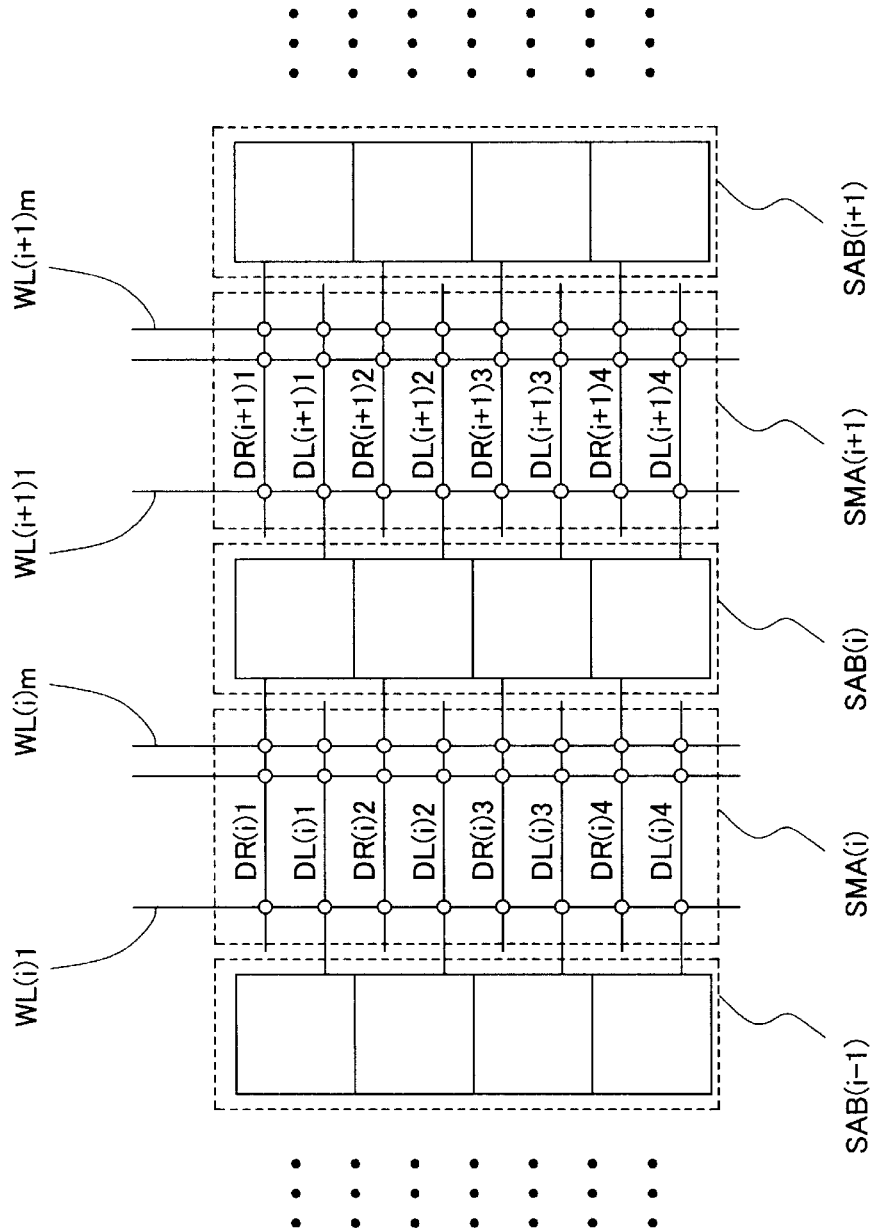
FIG. 23 is a configuration diagram of a one intersecting-point memory array.

FIG. 22 is an example in which the way of concept identical to FIG. 20 is applied to the "4:6 arrangement" layout shown in FIG. 18. This layout has repeated patterns with two sense amplifiers SA1 and SA2 as one group as viewed in an X direction. Data lines lying inside sense amplifiers and data lines in sub memory arrays are simply connected to SA1. On the other hand, a characteristic is brought about in that data lines lying inside the sense amplifiers and data lines in the sub memory array are connected to SA2 with twists. The present layout has a perfect self-reproduction structure in a manner similar to FIG. 1 with respect to a Y direction.

Since the adjacent data lines are in phase in a connection unit J1, the present layout is also good in compatibility with a combination with a memory cell array in which the interval between the data lines in FIG. 5B becomes 3F. Even in FIG.

22, an advantage is brought about in that the data lines are configured to be alternately charged and discharged in the memory array of the data lines, which is provided as the reference side, and noise produced in the coupling between the data lines at their amplification can be lessened. The present embodiment shows a case in which one contact pad sequence for sense amplifier control and power lines is provided in the same layer as the data lines in SAA with respect to one of data line pairs. Although the layout of a layer for the data lines becomes difficult, noise produced in the coupling of data line pairs to data lines in an adjacent sense amplifier area can be reduced by patterns for control and power lines.

The eleven types of typical layout patterns of FIGS. 1, 6, 10, 11, 14, 15, 18, 19, 20, 21 and 22 have been described above. However, the respective layout diagrams show the most typical ones. The modifications can be configured by typical geometrical symmetry operations (such as mirror reflection, rotation) respectively, fall within the category of the present invention. Since the layout shown in FIG. 1 has a mirror reflection axis (X mirror reflection axis) extending in an X direction with SAB as the center, for example, a layout turned back about the X mirror reflection axis is included in FIG. 1. Further, a first Y mirror reflection axis extending in a Y direction exists between SA1 and SA2. Furthermore, a second Y mirror reflection axis is provided even between SA3 and SA4. First, patterns, which mirror-reflect SA1 and SA2 with respect to the first Y mirror reflection axis, are produced, and patterns, which mirror-reflect SA3 and SA4 with respect to the first Y mirror reflection axis, are produced. An arranged one of these (row or sequence of mirror-reflected SA2, SA1, SA4 and SA3) is also included in FIG. 1.

According to a first layout of the present invention, wiring at a portion where patterns extremely vary as in the case of between sense amplifiers subjected-to sense amplifier alternate arrangements and sub memory arrays in a one intersecting-point memory cell array, can be prevented from breaking and shorting. According to a second layout of the present invention, noise produced in the coupling between data lines in a one intersecting-point memory array can be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
    a first memory array having a plurality of first memory cells provided at points where a first data line group including a first data line, a second data line adjacent to said first data line, a third data line adjacent to said second data line, and a fourth data line adjacent to said third data line intersect a plurality of first word lines;
    a second memory array having a plurality of second memory cells provided at points where a second data line group including a fifth data line, a sixth data line adjacent to said fifth data line, a seventh data line adjacent to said sixth data line, and an eighth data line adjacent to said seventh data line intersect a plurality of second word lines; and
    a first sense amplifier block provided between the first memory array and the second memory array and including a first sense amplifier and a second sense amplifier adjacent to each other;
    wherein the first sense amplifier is connected to the first data line and one data line of the second data line group so as to take an open data line arrangement,
    the second sense amplifier is connected to the fourth data line and another data line of the second data line group so as to take an open data line arrangement,
    wherein the first to eighth data line are formed on a first wiring layer and extend to a first direction,
    wherein the first sense amplifier block further includes first contact pads formed on the first wiring layer, extends to said first direction, and placed between the first and second sense amplifiers.

2. The semiconductor device according to claim 1, further comprising:
    second contact pads which are formed on the first wiring layer, and extend to said first direction, and
    third contact pads which are formed on the first wiring layer, and extend to said first direction,
    wherein said first sense amplifier lies between said first and second contact pads, and
    wherein said second sense amplifier lies between said first and third contact pads.

3. The semiconductor device according to claim 1, wherein the first to eighth data lines are formed by lithography using phase shift masks.

4. A semiconductor device comprising:
    a first memory array including a plurality of first memory cells provided at points where a first data line, a second data line, a third data line and a fourth data line, and a plurality of first word lines intersect;
    a second memory array including a plurality of second memory cells provided at points where a fifth data line, a sixth data line, a seventh data line and an eighth data line, and a plurality of second word lines intersect; and
    a first sense amplifier block provided between the first memory array and the second memory array and including a first sense amplifier and a second sense amplifier adjacent to each other, a ninth data line and a tenth data line connected to the first sense amplifier, and an eleventh data line and a twelfth data line connected to the second sense amplifier;
    wherein the first sense amplifier is connected to the first data line through the ninth data line and connected to the sixth data line through the tenth data line so as to take an open data line arrangement,
    the second sense amplifier is connected to the eighth data line through the eleventh data line and connected to the third data line through the twelfth data line so as to take an open data line arrangement, and
    wherein the first to eighth data line are formed on a first wiring layer and extend to a first direction,
    wherein the first sense amplifier block further includes first contact pads formed on the first wiring layer, extends to said first direction, and placed between the tenth and eleventh data lines.

5. The semiconductor device according to claim 4, wherein the first to eighth data lines are formed by lithography using phase shift masks.

* * * * *